United States Patent
Hayashi

(10) Patent No.: US 10,340,955 B2
(45) Date of Patent: Jul. 2, 2019

(54) DATA PROCESSING CIRCUIT

(71) Applicant: Renesas Electronics Corporation, Tokyo (JP)

(72) Inventor: Tomoichi Hayashi, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 14/995,985

(22) Filed: Jan. 14, 2016

(65) Prior Publication Data

US 2016/0283326 A1    Sep. 29, 2016

(30) Foreign Application Priority Data

Mar. 27, 2015   (JP) .................................. 2015-066301

(51) Int. Cl.
| | |
|---|---|
| *G06F 11/10* | (2006.01) |
| *G06F 12/16* | (2006.01) |
| *G11C 29/42* | (2006.01) |
| *H03M 13/29* | (2006.01) |

(Continued)

(52) U.S. Cl.
CPC ....... *H03M 13/2906* (2013.01); *H03M 13/19* (2013.01); *H03M 13/6561* (2013.01)

(58) Field of Classification Search
CPC ........... G06F 11/1076; H03M 13/2906; H03M 13/19; H03M 13/6561
See application file for complete search history.

(56) References Cited

U.S. PATENT DOCUMENTS 4,359,772 A * 11/1982 Patel ..................... H03M 13/19
714/761
5,781,918 A * 7/1998 Lieberman .......... G06F 11/1016
710/66

(Continued)

FOREIGN PATENT DOCUMENTS

| JP | S56-94597 A | 7/1981 |
|---|---|---|
| JP | H 05-165736 A | 7/1993 |

(Continued)

OTHER PUBLICATIONS

Japanese Office Action dated Nov. 27, 2018, corresponding Japanese Patent Application No. 2015-066301, with an English translation thereof.

*Primary Examiner* — Phung M Chung

(74) *Attorney, Agent, or Firm* — McGinn I.P. Law Group, PLLC.

(57) ABSTRACT

A data processing circuit includes an error processing circuit and a memory. Word data is configured by main body data to be divided into a plurality of partial words and redundant data. The redundant data is configured by error correction additional bits generated from the main body data on the basis of a predetermined error correction algorithm and the error correction additional bits include a plurality of parity bits corresponding to the partial words. The error processing circuit includes error correction circuit and parity check circuit into which the word data is input in parallel. The error correction circuit decides an error type by using the redundant data and corrects a correctable error. The parity check circuit performs a parity check on the basis of access-requested partial word and the corresponding parity bit.

16 Claims, 20 Drawing Sheets

(51) Int. Cl.
    *H03M 13/00* (2006.01)
    *H03M 13/19* (2006.01)

(56) References Cited

U.S. PATENT DOCUMENTS

| | | | | |
|---|---|---|---|---|
| 6,185,134 B1* | 2/2001 | Tanaka | ................ | G11C 11/5621 |
| | | | | 365/185.33 |
| 7,913,110 B2* | 3/2011 | Van Acht | ............ | G06F 11/1068 |
| | | | | 714/6.1 |
| 8,468,434 B2* | 6/2013 | Toda | ................... | H03M 13/152 |
| | | | | 714/782 |
| 8,671,329 B2* | 3/2014 | Kumar | ................ | G06F 11/1052 |
| | | | | 365/189.02 |
| 2007/0214403 A1* | 9/2007 | Longwell | .............. | G06F 11/106 |
| | | | | 714/800 |

FOREIGN PATENT DOCUMENTS

JP        H 10-97471 A      4/1998
JP        2013-070122 A      4/2013

* cited by examiner

FIG. 1

$$\begin{pmatrix} 1\,1\,\cdots\,0 \\ 1\,0\,\cdots\,1 \\ \vdots \\ 0\,1\,\cdots\,1 \\ \hline 1\,1\,\cdots\,1 \end{pmatrix} \times \begin{pmatrix} d_0 \\ d_1 \\ \vdots \\ d_{k-1} \end{pmatrix} = \begin{pmatrix} p_0 \\ p_1 \\ \vdots \\ p_m \end{pmatrix}$$

k COLUMNS, m+1 ROWS

FIG. 2

$$\begin{pmatrix} 1\,1\,\cdots\,0 & 1\,0\,\cdots\,0\,0 \\ 1\,0\,\cdots\,1 & 0\,1\,\cdots\,0\,0 \\ \vdots & \vdots \\ 0\,1\,\cdots\,1 & 0\,0\,\cdots\,1\,0 \\ \hline 1\,1\,\cdots\,1 & 0\,0\,\cdots\,0\,1 \end{pmatrix} \times \begin{pmatrix} x_0 \\ x_1 \\ \vdots \\ x_{k-1} \\ p_0 \\ p_1 \\ \vdots \\ p_m \end{pmatrix} = \begin{pmatrix} s_0 \\ s_1 \\ \vdots \\ s_m \end{pmatrix}$$

k COLUMNS, m+1 COLUMNS, m+1 ROWS

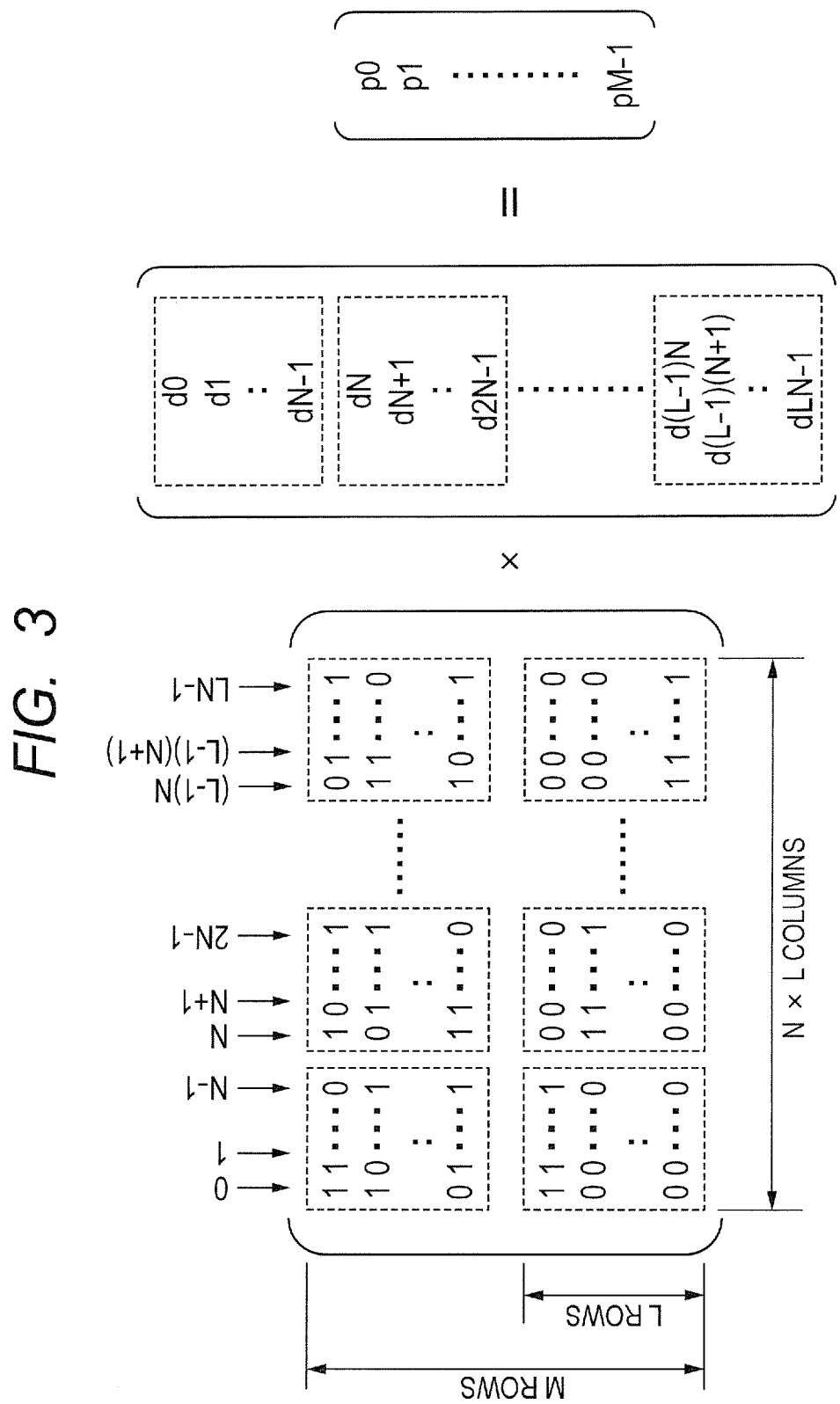

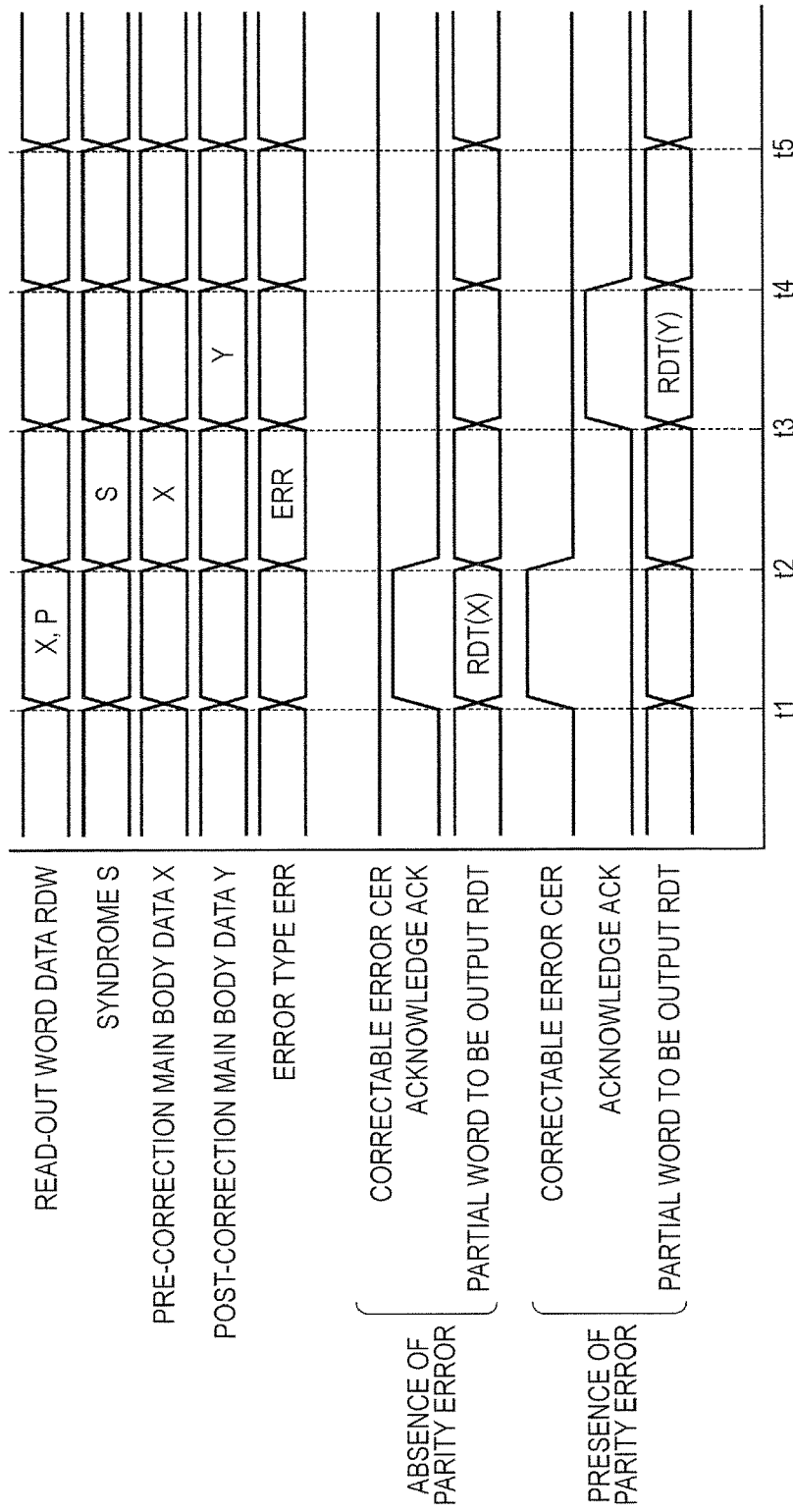

FIG. 9

$$\begin{pmatrix} 1\ 1\ 0 & 1\ 0\ 1 & 0\ 0\ 1 \\ 1\ 0\ 1 & 0\ 1\ 1 & 0\ 1\ 0 \\ 0\ 1\ 1 & 1\ 1\ 0 & 1\ 0\ 0 \\ 1\ 1\ 1 & 0\ 0\ 0 & 1\ 1\ 1 \\ 0\ 0\ 0 & 1\ 1\ 1 & 1\ 1\ 1 \end{pmatrix} \times \begin{pmatrix} d0 \\ d1 \\ d2 \\ d3 \\ d4 \\ d5 \\ d6 \\ d7 \\ d8 \end{pmatrix} = \begin{pmatrix} p0 \\ p1 \\ p2 \\ p3 \\ p4 \end{pmatrix}$$

FIG. 10

$$\begin{pmatrix} 1\ 1\ 0 & 1\ 0\ 1 & 0\ 0\ 1 & 1\ 0\ 0\ 0\ 0 \\ 1\ 0\ 1 & 0\ 1\ 1 & 0\ 1\ 0 & 0\ 1\ 0\ 0\ 0 \\ 0\ 1\ 1 & 1\ 1\ 0 & 1\ 0\ 0 & 0\ 0\ 1\ 0\ 0 \\ 1\ 1\ 1 & 0\ 0\ 0 & 1\ 1\ 1 & 0\ 0\ 0\ 1\ 0 \\ 0\ 0\ 0 & 1\ 1\ 1 & 1\ 1\ 1 & 0\ 0\ 0\ 0\ 1 \end{pmatrix} \times \begin{pmatrix} x0 \\ x1 \\ x2 \\ x3 \\ x4 \\ x5 \\ x6 \\ x7 \\ x8 \\ p0 \\ p1 \\ p2 \\ p3 \\ p4 \end{pmatrix} = \begin{pmatrix} s0 \\ s1 \\ s2 \\ s3 \\ s4 \end{pmatrix}$$

FIG. 11

$$\begin{pmatrix} 1\,1\,0 & 1\,0\,1 & 0\,1\,1 \\ 1\,0\,1 & 0\,1\,1 & 1\,1\,0 \\ 0\,1\,1 & 1\,1\,0 & 1\,0\,1 \\ 1\,1\,1 & 0\,0\,0 & 0\,0\,0 \\ 0\,0\,0 & 1\,1\,1 & 0\,0\,0 \\ 0\,0\,0 & 0\,0\,0 & 1\,1\,1 \end{pmatrix} \times \begin{pmatrix} d0 \\ d1 \\ d2 \\ d3 \\ d4 \\ d5 \\ d6 \\ d7 \\ d8 \end{pmatrix} = \begin{pmatrix} p0 \\ p1 \\ p2 \\ p3 \\ p4 \\ p5 \end{pmatrix}$$

FIG. 12

$$\begin{pmatrix} 1\,1\,0 & 1\,0\,1 & 0\,0\,1 & 1\,0\,0\,0\,0\,0 \\ 1\,0\,1 & 0\,1\,1 & 0\,1\,0 & 0\,1\,0\,0\,0\,0 \\ 0\,1\,1 & 1\,1\,0 & 1\,0\,0 & 0\,0\,1\,0\,0\,0 \\ 1\,1\,1 & 0\,0\,0 & 0\,0\,0 & 0\,0\,0\,1\,0\,0 \\ 0\,0\,0 & 1\,1\,1 & 0\,0\,0 & 0\,0\,0\,0\,1\,0 \\ 0\,0\,0 & 0\,0\,0 & 1\,1\,1 & 0\,0\,0\,0\,0\,1 \end{pmatrix} \times \begin{pmatrix} x0 \\ x1 \\ x2 \\ x3 \\ x4 \\ x5 \\ x6 \\ x7 \\ x8 \\ p0 \\ p1 \\ p2 \\ p3 \\ p4 \\ p5 \end{pmatrix} = \begin{pmatrix} s0 \\ s1 \\ s2 \\ s3 \\ s4 \\ s5 \end{pmatrix}$$

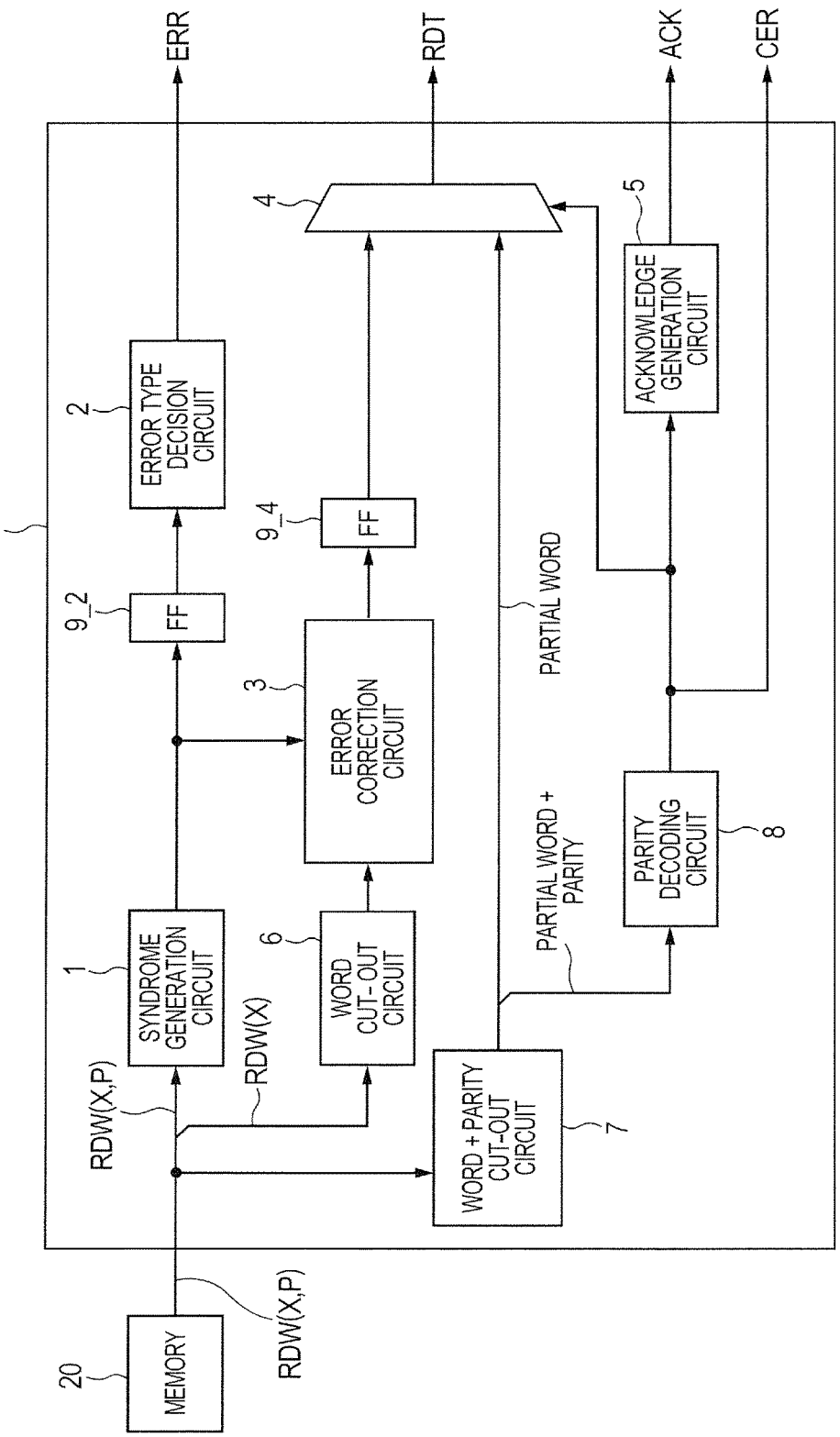

FIG. 15

$$\begin{pmatrix} 1\,1\,0 & 1\,1\,0 & 1\,1\,0 \\ 1\,0\,1 & 1\,0\,1 & 1\,0\,1 \\ 0\,1\,1 & 0\,1\,1 & 0\,1\,1 \\ 1\,1\,1 & 0\,0\,0 & 0\,0\,0 \\ 0\,0\,0 & 1\,1\,1 & 0\,0\,0 \\ 0\,0\,0 & 0\,0\,0 & 1\,1\,1 \end{pmatrix} \times \begin{pmatrix} d0 \\ d1 \\ d2 \\ d3 \\ d4 \\ d5 \\ d6 \\ d7 \\ d8 \end{pmatrix} = \begin{pmatrix} p0 \\ p1 \\ p2 \\ p3 \\ p4 \\ p5 \end{pmatrix}$$

FIG. 16

$$\begin{pmatrix} 1\,1\,0 & 1\,1\,0 & 1\,1\,0 & 1\,0\,0\,0\,0\,0 \\ 1\,0\,1 & 1\,0\,1 & 1\,0\,1 & 0\,1\,0\,0\,0\,0 \\ 0\,1\,1 & 0\,1\,1 & 0\,1\,1 & 0\,0\,1\,0\,0\,0 \\ 1\,1\,1 & 0\,0\,0 & 0\,0\,0 & 0\,0\,0\,1\,0\,0 \\ 0\,0\,0 & 1\,1\,1 & 0\,0\,0 & 0\,0\,0\,0\,1\,0 \\ 0\,0\,0 & 0\,0\,0 & 1\,1\,1 & 0\,0\,0\,0\,0\,1 \end{pmatrix} \times \begin{pmatrix} x0 \\ x1 \\ x2 \\ x3 \\ x4 \\ x5 \\ x6 \\ x7 \\ x8 \\ p0 \\ p1 \\ p2 \\ p3 \\ p4 \\ p5 \end{pmatrix} = \begin{pmatrix} s0 \\ s1 \\ s2 \\ s3 \\ s4 \\ s5 \end{pmatrix}$$

DATA PROCESSING CIRCUIT

CROSS-REFERENCE TO RELATED APPLICATIONS

The disclosure of Japanese Patent Application No. 2015-066301 filed on Mar. 27, 2015 including the specification, drawings and abstract is incorporated herein by reference in its entirety.

BACKGROUND

The present invention relates to a data processing circuit and more particularly relates to the data processing circuit of the type which is favorably utilized for a memory that data which has been written into the memory is protected with an error correction code and also favorably utilized for error correction processing to be performed on the data which is read out of the memory.

In order to improve the reliability of the memory, there is adopted the memory of the type configured to store main body data to be stored by adding an error correction code (ECC) to the main body data so as to perform error detection and error correction processing on the read-out data. In such a memory as mentioned above, a single error correction-double error detection (SECDED) code with which a single-bit error is corrected and a double-bit error is detected (the double-bit error is uncorrectable) is frequently used.

In Japanese Unexamined Patent Application Publication No. Hei 5(1993)-165736, a circuit system which corrects the double-bit error by a simple circuit by using the SECDED code is disclosed.

In Japanese Unexamined Patent Application Publication No. Hei 10(1998)-97471, a method of correcting errors in data stored in the memory in block transfer of the data is disclosed. The ECC code is added to whole data block, the data block is divided into a plurality of data strings and a parity bit is added to each data string.

As a result of examinations that the inventors and others of the present invention performed on the system and the method respectively disclosed in Japanese Unexamined Patent Application Publication Nos. Hei 5(1993)-165736 and Hei 10(1998)-97471, it was found that there still remain new subject matters as follows.

In the memory to which an access is made from a processor such as a CPU (Central Processing Unit) and so forth, an instruction code length (for example, a 32-bit instruction, a 64-bit instruction and so forth), a data length or the like is set as an access unit that the access is made to the memory. However, a circuit configuration of the memory itself has such a tendency that the data length per word is increased in order of 128 bits, 256 bits and so on more steeply than the access unit. Therefore, when reading data, part corresponding to an address reading of which has been requested is physically cut out of the data to be read out word by word and is output. At that time, the ECC code is added to one-word data. That is, part of the bit length to be read out word by word is main body data and other part is ECC additional bits generated from the main body data. An error correction processing circuit generates syndromes from the whole read-out data (the main body data and the ECC additional bits), decides presence/absence of an error, a single-bit error or a double-bit error as an error type, outputs a result of decision and, in the presence of the single-bit error, corrects the error in the main body data and outputs the main body data.

Since inputting of all of the main body data and the ECC additional bits is necessary for generation of the syndromes and decision of the error type, in general, a time taken for decision of the error type is increased in proportion to a logarithm of the data length. For example, when nine ECC additional bits are added to 128-bit data, a delay taken for decision of the error type is estimated to be eight two-input exclusive OR gates and five two-input OR gates. When ten ECC additional bits are added to 256-bit data, the delay is estimated to be nine two-input exclusive OR gates and five two-input OR gates. The delay depends on the number of such gates which are serially arranged and also depends on a wiring load to be exerted with an increase in scale of the gates which are arranged in a parallel direction. As mentioned above, the delay taken for generation of the syndromes and decision of the error type largely depends on the data length.

On the other hand, it was found that there is a tendency that speeding-up of the processor is demanded and the possibility that the delay taken for generation of the syndromes and decision of the error type may become a dominant cause for impeding an increase in access speed of the memory and impeding speeding-up of the processor is high.

SUMMARY

Although measures for solving the subject matters as mentioned above will be described as follows, other subject matters and novel features of the present invention will become apparent from the following description of the specification and the appended drawings of the present invention.

A data processing circuit according to one embodiment of the present invention will be described as follows.

That is, the data processing circuit includes a memory into which word data configured by main body data and redundant data is stored and out of which the word data is read in units of the word data and an error processing circuit. The data processing circuit is configured as follows.

The main body data is divided into a plurality of partial words. The redundant data is configured by error correction additional bits the whole of which has been generated from the main body data on the basis of a predetermined error correction algorithm and the error correction additional bits include a plurality of parity bits respectively corresponding to the plurality of partial words.

The error processing circuit includes an error correction circuit and a parity check circuit into which the word data read out of the memory is input in parallel. The error correction circuit decides the type of an error in the main body data included in the input word data by using the redundant data included in the input word data and corrects a correctable error. The parity check circuit performs a parity check on the basis of the partial word included in the input word data and the parity bit corresponding to the partial word concerned.

The advantageous effects obtained by the data processing circuit according to one embodiment of the present invention will be briefly described as follows.

That is, in the memory out of which the word data which includes the plurality of partial words each of which is set as the access unit to be accessed from the outside and which is added with an error correction code is read in units of the word data, it is possible to suppress a reduction in access speed in association with an increase in word length.

BRIEF DESCRIPTION OF THE DRAWINGS

FIG. 1 is an explanatory diagram illustrating one example of a method of generating ECC additional bits in an SECDED code according to a first embodiment.

FIG. 2 is an explanatory diagram illustrating one example of a method of generating syndromes in the SECDED code according to the first embodiment.

FIG. 3 is an explanatory diagram illustrating one example of a method of generating the ECC additional bits in an error correction algorithm that each embodiment utilizes.

FIG. 8 is a timing chart illustrating one operational example of the error processing circuit in FIG. 6.

FIG. 9 is an explanatory diagram illustrating one example of a method of generating the ECC additional bits included in the word data to be input into the error processing circuit in FIG. 5 in the comparative example.

FIG. 10 is an explanatory diagram illustrating one example of a method of generating the syndromes in the error processing circuit in FIG. 5 in the comparative example.

FIG. 11 is an explanatory diagram illustrating one example of a method of generating the ECC additional bits included in the word data to be input into the error processing circuit in FIG. 6 according to the second embodiment.

FIG. 12 is an explanatory diagram illustrating one example of a method of generating the syndromes in the error processing circuit in FIG. 6 according to the second embodiment.

FIG. 14 is a block diagram illustrating one configurational example of a data processing circuit according to a third embodiment that the error processing circuit is added to the memory.

FIG. 15 is an explanatory diagram illustrating one example of a method of generating the ECC additional bits included in the word data to be input into the error processing circuit in FIG. 14 according to the third embodiment.

FIG. 16 is an explanatory diagram illustrating one example of a method of generating the syndromes in the error processing circuit in FIG. 14 according to the third embodiment.

DETAILED DESCRIPTION

Figure 4:
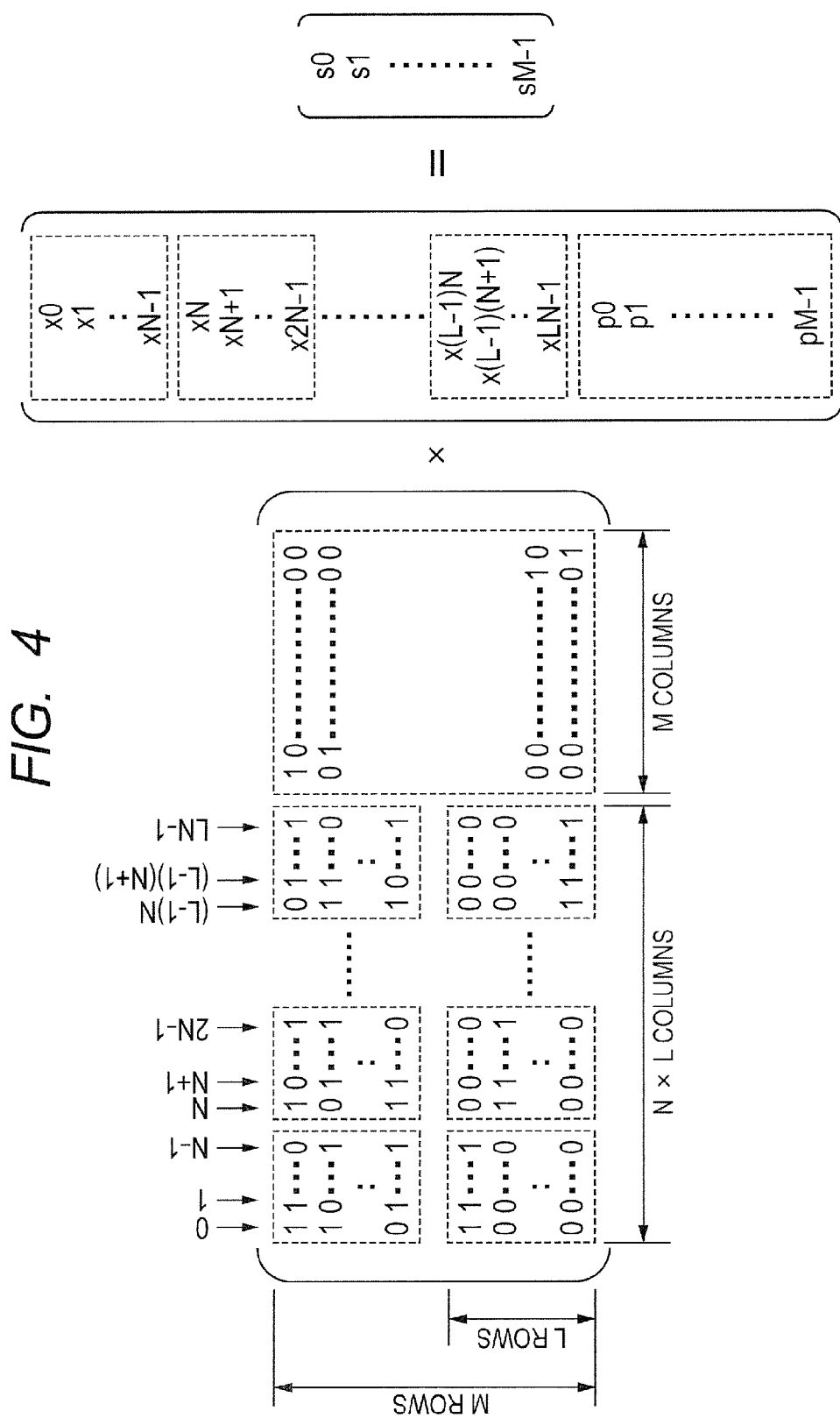
FIG. 4 is an explanatory diagram illustrating one example of a method of generating the syndromes in the error correction algorithm that each embodiment utilizes.

In the following, preferred embodiments of the present invention will be described in detail with reference to the accompanying drawings. Incidentally, in all of the drawings which are appended in order to illustrate the embodiments of the present invention, the same numerals or symbols are assigned to the same parts in principle and repetitive description thereof is omitted.

First Embodiment

<Operational Principle>

First, the error correction algorithm that each embodiment of the present invention utilizes will be briefly described.

The basic algorithm is a Hamming code. The Hamming code is a code in which the number of different things is $2^m-1$ in an m-dimensional vector which is not "0" on a Galois Field GF (2) that "2" is set as a modulus for an optional positive integer m and therefore a matrix that all of them are arrayed as columns is used as a check matrix and which is $2^m-1$ in code length n and n-m in information bit number k (k and n are positive integers). Here, "$2^m$" means m-th power of "2" (the same also applies to the entire of the specification of the present invention). In the Hamming code, a minimum distance between code words is three and it is possible to correct a single-bit error with the Hamming code. On the other hand, a code which makes it possible to detect a double-bit error by increasing the minimum distance between the code words to four is an extended Hamming code and one typical example of the extended Hamming code is the SECDED code.

The algorithm of the SECDED code will be described.

FIG. 1 is an explanatory diagram illustrating one example of a method of generating the ECC additional bits in the SECDED code. m ECC additional bits (p0 to pm) are generated by multiplying k information bits (d0 to dk−1) by a generation matrix of m+1 rows×k columns (k and m are positive integers). In the generation matrix, respective columns in a matrix of m rows×k columns which is illustrated on the upper side of FIG. 1 are configured by the "different things in the m-dimensional vector" similarly to the Hamming code, that is, configured by mutually different vectors in $2^m-1$ combinations other than a combination that all bits are "0s". It is possible to increase the minimum distance between the code words to four as mentioned above by adding a row that all bits are "1s" to the lowermost stage and thereby a function of detecting the double-bit error is added in addition to the function of correcting the single-bit error. Alternatively, the minimum distance between the code words may be increased to four as mentioned above also by configuring such that the mutually different vectors each have an odd number of "1s" and thereby the function of detecting the double-bit error is also added in addition to the function of correcting the single-bit error. Each vector may be also configured so as to have an even number of "1s".

The information bits d0 to dk−1 and the generated ECC additional bits p0 to pm are conjoined together, stored into the memory and read out of the memory. Pieces of data to be read out of the memory are denoted by x0 to xk−1 and p0 to pm. The pieces of data x0 to xk−1 are the same as the information bits d0 to dk−1 when there is no error. Although there is the possibility that the error may be generated also in the ECC additional bits p0 to pm, the same codes are used for the ECC additional bits to be read out of the memory as they are for convenience. For decision of the error type, first, the syndromes are obtained.

FIG. 2 is an explanatory diagram illustrating one example of a method of generating syndromes in the SECDED code. Syndromes s0 to sm are generated by multiplying the pieces of data x0 to xk−1 and p0 to pm which have been read out of the memory by a check matrix of m+1 rows×k+m+1 columns. The check matrix is configured by conjoining together the above-mentioned generation matrix of m+1 rows×k columns and a unit matrix of m+1 rows×1 column.

The generated syndromes s0 to sm are used for decision of the error type. When all of the syndromes s0 to sm are "0s", it is decided that there is no error. The syndromes s0 to sm are compared with each column of a part corresponding to the above-mentioned generation matrix of m+1 rows×k columns in the check matrix and when there is the column which matches the syndromes, it is decided that the single-bit error is generated, and when there is no column which matches the syndromes, it is decided that the double-bit error is generated and no correction is made on the error. No decision is made on errors of three or more bits.

Since the number of the column which matches the syndromes s0 to sm corresponds to the number of a bit position of the information bit that the error has been generated, the error is corrected by inverting data at the corresponding bit position in the pieces of data x0 to xk−1 which have been read out of the memory and thereby the information bits d0 to dk−1 are restored.

FIG. 3 is an explanatory diagram illustrating one example of a method of generating the ECC additional bits in the error correction algorithm that each embodiment utilizes. M ECC additional bits (p0 to pM−1) are generated by multiplying N×L information bits by a generation matrix of M rows×N×L columns (L, M and N are positive integers). The information bits are divided into partial words in units of N bits and are configured by L partial words. That is, a first partial word is expressed by "do, d1, . . . and dN−1", a second partial word is expressed by "dN, dN+1, . . . and d2N−1", and succeeding partial words are continuously expressed in this way up to an L-th partial word expressed by "d(L−1)N, d(L−1) (N+1), . . . and dLN−1". The bit length of all of the information bits is N×L bits.

The generation matrix is configured by M rows×N×L columns. The point that the number of columns is the same as the number of bits of the information bits is the same as the case of the SECDED code illustrated in FIG. 1. A 0-th column to an N−1-th column of the generation matrix respectively correspond to do, d1, . . . and dN−1 of the first partial word, an N-th column to a 2N−1-th column of the generation matrix respectively correspond to dN, dN+1, . . . and d2N−1 of the second partial word. Likewise, a (L−1)N-th column to an LN−1-th column of the generation matrix respectively correspond to d(L−1)N, d(L−1) (N+1), . . . and dLN−1 of the L-th partial word.

m rows in the M rows of the generation matrix are "the different things in the m-dimensional vector" similarly to the Hamming code and are configured by the mutually different vectors in the 2^m−1 combinations other than the combination that all bits are "0s". While, in the SECDED code, the minimum distance between the code words is increased to four by adding one row and thereby the function of detecting the double-bit error is added, in the present algorithm (the error correction algorithm that each embodiment of the present invention utilizes), L rows are added. In the added L rows, only columns corresponding to the partial words are configured by "1" and other columns are configured by "0s". Since the number of rows to be added is large, there are cases where the minimum distance between the code words becomes larger than four. In this case, it is possible to reduce the total number of rows M as long as each column may satisfy a requirement for the SECDED code. The requirement for the SECDED code means, here, for example, a specification that "all of the columns are mutually different and each column has the odd number of "1s". The reason is such that single-bit error correction and double-bit error detection become possible by satisfying the requirement for the SECDED code by the M rows in total including the added L rows.

Some of the ECC additional bits (p0 to pM−1) generated by using this generation matrix configure parity bits corresponding to the respective partial words. That is, the ECC additional bit pM-L which is generated by an M-L+1-th row that only the columns corresponding to d0, d1, . . . and dN−1 of the first partial word are "1s" is generated as the exclusive OR of d0, d1, . . . and dN−1 and configures the parity bit for giving an even-numbered parity to the first partial word. Likewise, the ECC additional bit pM-L+1 which correspond to the second partial word dN, dN+1, . . . and d2N−1 configures the parity bit for giving the even-numbered parity to the second partial word. The same sequentially applies thereinafter and the ECC additional bit pM−1 which corresponds to the L-th partial word d(L−1)N, d(L−1) (N+1), . . . and dLN−1 configures the parity bit for giving the even-numbered parity to the L-th partial word.

FIG. 4 is an explanatory diagram illustrating one example of a method of generating syndromes in the present algorithm. Similarly to the case of the SECDED code which has been described with reference to FIG. 2, syndromes s0 to sM−1 are generated by multiplying pieces of data x0, x1, . . . and xN−1, xN, xN+1, . . . and x2N−1, . . . , x(L−1)N, x(L−1) (N+1), . . . and xLN−1, and p0 to pM−1 which have been read out of the memory by a check matrix of M rows×N×L+M columns. The check matrix is configured by conjoining together the above-mentioned generation matrix of M rows×N×L columns and a unit matrix of M rows×M columns.

The generated syndromes s0 to sM−1 are used for decision of the error type. When all of the syndromes s0 to sM−1 are "0s", is it decided that there is no error. The syndromes s0 to sM−1 are compared with each column of the part corresponding to the above-mentioned generation matrix of M rows×N×L columns in the check matrix and when there is the column which matches the syndromes, it is decided that the single-bit error is generated, and when there is no column which matches the syndromes, it is decided that the double-bit error is generated and no correction is made on the error. No decision is made on the errors of three or more bits.

The number of the column which matches the syndromes s0 to sM−1 corresponds to the number of the bit position of the information bit that the error has been generated. The error is corrected by inverting data at the corresponding bit position in the pieces of data x0, x1, . . . and xN−1, xN, xN+1, . . . and x2N−1, . . . , x(L−1)N, x(L−1) (N+1), . . . and xLN−1 which have been read out of the memory and thereby information bits d0, d1, . . . and dN−1, dN, dN+1, . . . and d2N−1, . . . d(L−1)N, d(L−1) (N+1), . . . dLN−1 are restored.

As described above, error correction by the present algorithm is performed in the same manner as that by the SECDED code.

Since, in the present algorithm, as described above, the parities pM-L to pM−1 configure parity bits respectively corresponding to the first to the L-th partial words, it is possible to execute a parity check (parity decoding) for every partial word in parallel with execution of the above-mentioned syndrome generation and error type decision. The parity decoding may be either performed on all of the partial words in parallel or sequentially performed on the partial words in time division.

Incidentally, all of the illustrated matrixes are linear and row replacement and column replacement may be optionally performed.

The memory to which the present algorithm is applied is a memory that one word which includes the main body data and the ECC additional bits is used as a unit for data writing and reading and the partial word is set as the access unit that the access is made from the outside. The memory is a ROM (Read Only Memory) such as, for example, a flash memory and so forth and an error processing circuit to which the present algorithm is applied is added to the memory. As an alternative, the memory may be configured by a RAM (Random Access memory) and further an encoding circuit which generates the ECC additional bits from write data (also an address may be included) may be added to the memory. The above-mentioned error type decision and error correction are executed on the whole data which has been read out of the memory and the parity check is executed on the partial word in parallel with execution of the above-mentioned error type decision and error correction. That is, the partial word and the corresponding parity are drawn out of the data which has been read out of the memory, the parity decoding (the parity check) is executed targeting on the drawn-out partial word and parity and thereby it is possible to decide whether there is the single-bit error in the partial word concerned. Since only the parity is checked, what to do is limited to detection of the single-bit error and no correction is made on the error here.

As described above, in the present algorithm, since the single-bit error correction and the double-bit error detection which are the same as those by the SECDED code are performed on the whole data which has been read out of the memory, it is possible to execute the parity check for every partial word in parallel with execution of generation of the syndromes s0 to sM−1 from N×L+M bits and decision of the error type. Since N+1 bits are input for the parity check to be performed for every partial word and N+1 bits correspond to about 1/L of N×L+M bits used for the above-mentioned syndrome generation, a circuit delay is very small. The number of bits of the above-mentioned partial word is made to match the access unit of the memory and thereby it is possible to promptly detect that there is no single-bit error in the partial word to which an access request has been made. In the presence of the single-bit error, the partial word is output, waiting until error correction of the whole data which has been read out of the memory is completed. In addition, in the presence of the double-bit error in the whole data which has been read out of the memory, there are cases where it is difficult to detect the error by the parity check which is made for every partial word. Data processing to be performed in this case is entrusted to the rear stage. In the actual circuit operation, no error is generated in most cases, generation of the single-bit error is rare and generation of the double-bit error is rarer than the generation of the single-bit error. Accordingly, since an average access speed of the memory is predominantly defined depending on the delay when there is no error, it is possible to improve the access performance of the memory as a whole.

Although, in the foregoing, description has been made on utilization of the error correction algorithm based on the Hamming code and the extended Hamming code (the SECDED code), the code may be changed to another error correction code. That is, the generation matrix and the check matrix are configured such that the ECC additional bits used for error correction to be performed targeting on the whole main body data conforming to the predetermined error correction algorithm include the parity bits which are set for the respective partial words when the main body data has been divided into the plurality of partial words. The memory uses one word which includes the main body data and the ECC additional bits as a unit for data writing and reading and sets the partial word as the access unit that the access is made from the outside. When the main body data and the ECC additional bits are stored in the memory and are read out of the memory later, parity decoding (the parity check) of the partial word to which the access request has been made is executed in parallel with execution of decision of the error type and error correction conforming to the error correction algorithm concerned by using the main body data and the ECC additional bits. When it has been decided that there is no error in the access-requested partial word as a result of execution of the parity decoding (the parity check), it is possible to output the corresponding partial word from the read-out data at a high speed. On the other hand, when presence of the error has been decided, error correction is appropriately performed on the basis of a result of the above-mentioned error type decision conforming to the error correction algorithm concerned and notice for shifting to error processing to be performed at the rear stage such as outputting of the access-requested partial word from the corrected data, invalidation of data on the output partial word and so forth is given. Thereby, it is possible to suppress a reduction in access speed in association with an increase in word length in the memory out of which the word data which includes the plurality of partial words each of which is the access unit that the access is made from the outside is read in units of the word data by adding the error correction code (the ECC additional bits) to the word data Second Embodiment <Parallelization of Parity Decoding>

A more detailed embodiment will be described.

Figure 5:
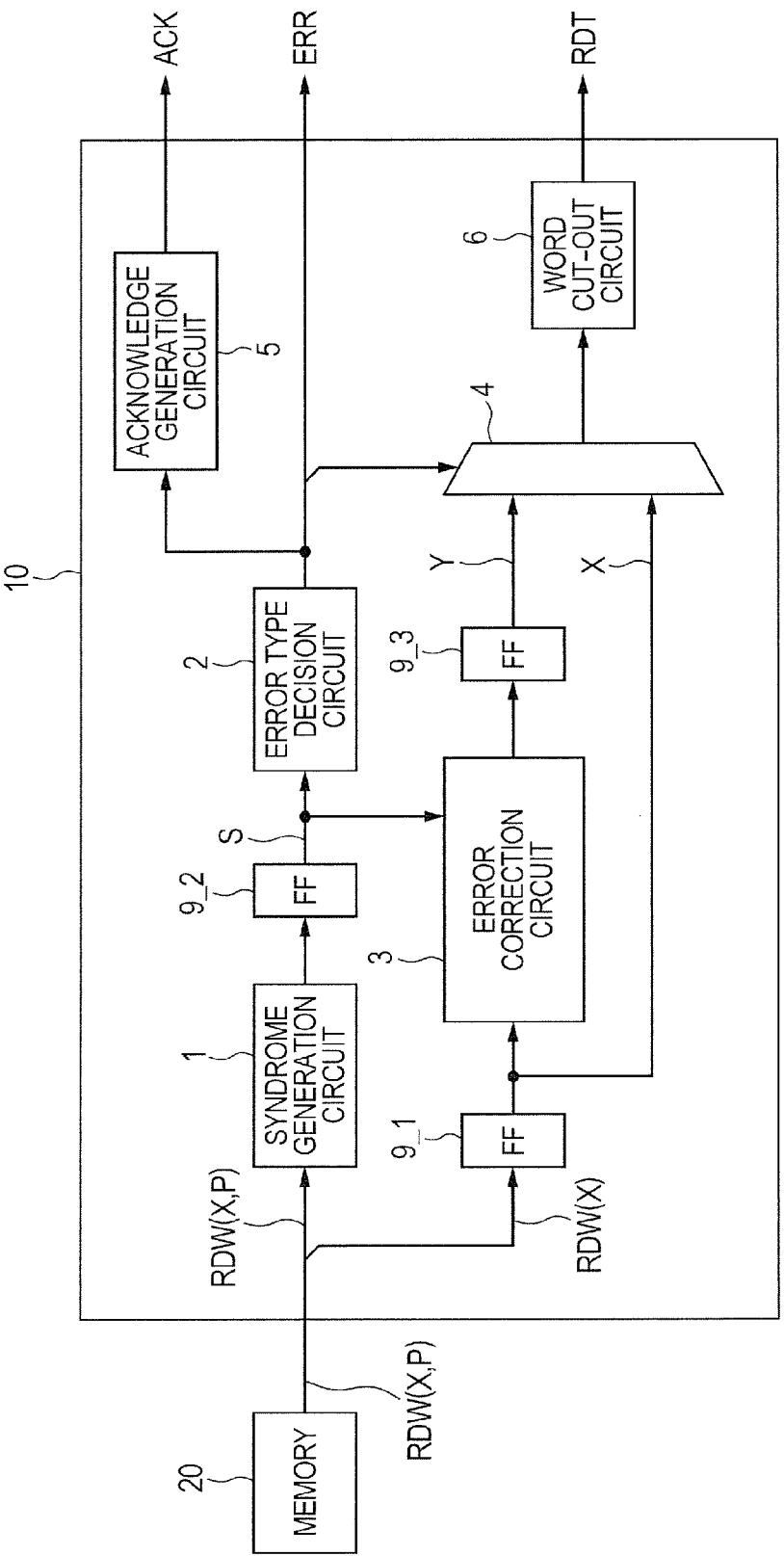
FIG. 5 is a block diagram illustrating one configurational example of a data processing circuit of a comparative example that the error processing circuit is added to the memory.
Figure 6:
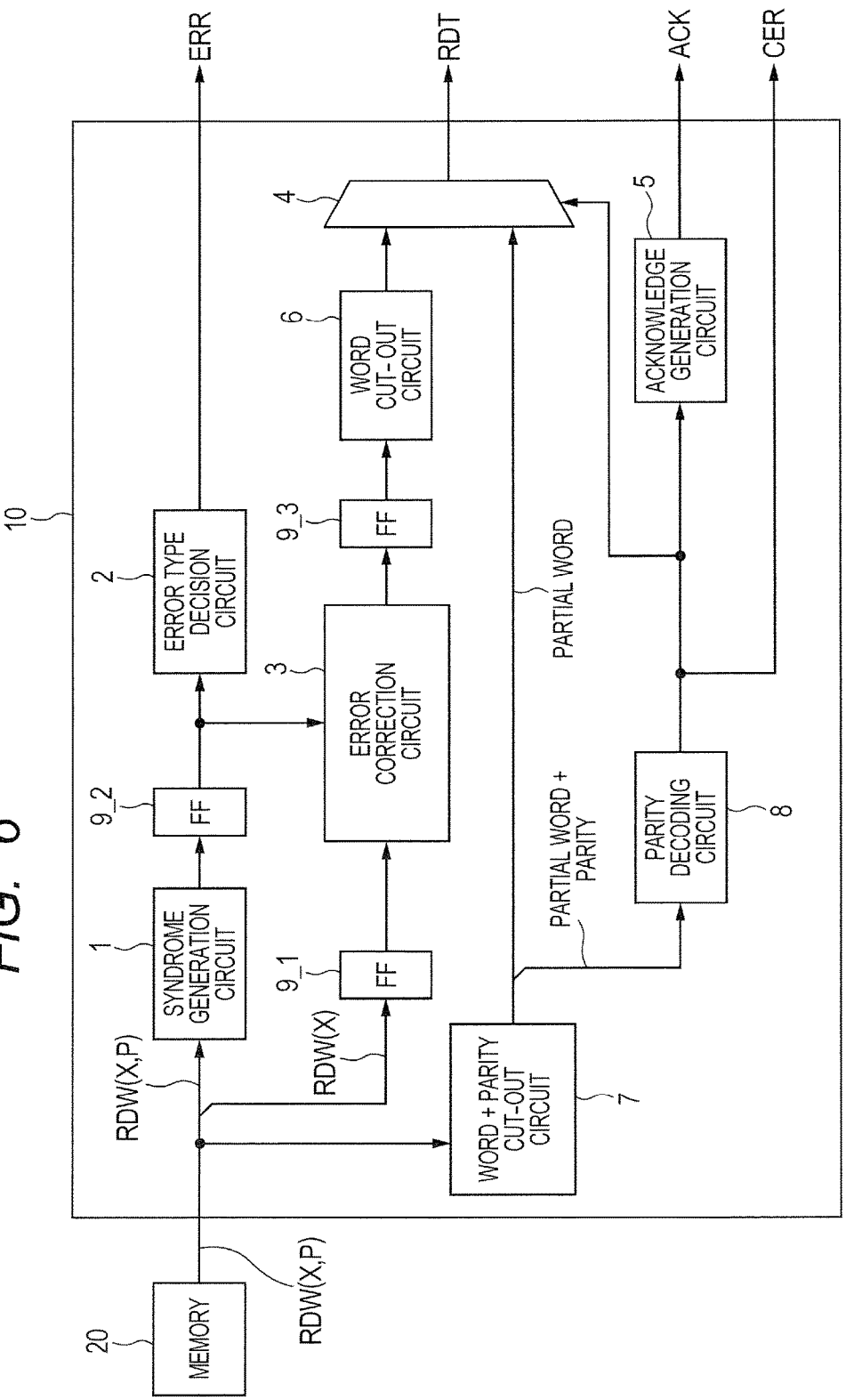
FIG. 6 is a block diagram illustrating one configurational example of a data processing circuit according to a second embodiment that the error processing circuit is added to the memory.

FIG. 5 is a block diagram illustrating one configurational example of a data processing circuit of a comparative example that the error processing circuit is added to the memory. FIG. 6 is a block diagram illustrating one configurational example of a data processing circuit according to the second embodiment. Although, in the drawings, wiring is digital signal wiring of a bus configuration configured by one or a plurality of set (s) of signal wiring, illustration of the bus is omitted. In addition, illustration of a signal line for configuring and controlling a pipeline such as a clock signal line and so forth and a signal line for controlling the access to the memory such as an address line and so forth is omitted. The same also applies to other drawings for other embodiments of the present invention.

The data processing circuit of the comparative example illustrated in FIG. 5 is configured by coupling an error processing circuit 10 to a memory 20. The error processing circuit 10 includes a syndrome generation circuit 1, an error type decision circuit 2, an error correction circuit 3, a corrected data selection circuit 4, an acknowledge generation circuit 5, a word cut-out circuit 6 and a plurality of flip-flops 9_1 to 9_3 which configure a pipeline. Data RDW to be read out of the memory 20 is word data which includes main body data X and ECC additional bits P. The whole read-out word data RDW (X, P) is supplied to the syndrome generation circuit 1 and the main body data part RDW (X) is supplied to the error correction circuit 3 via the flip-flop 9_1. A syndrome which has been generated by the syndrome generation circuit 1 is supplied to the error type decision circuit 2 and the error correction circuit 3 via the flip-flop 9_2. The error type decision circuit 2 decides what the error type is, "no-error (NED: No Error Detected)", "the single-bit error (SEC: Single Error Corrected)" or "the double-bit error (DED: Double Error Detected)" and outputs a result of decision as an error type ERR. The error correction circuit 3 executes error correction processing on the read-out pre-correction main body data X on the basis of the input syndrome S and outputs post-correction main body data Y to the corrected data selection circuit via the flip-flop 9_3. The corrected data selection circuit 4 selects and outputs either the pre-correction main body data X or the post-correction main body data Y on the basis of the error type ERR to the word cut-out circuit 6. In case of the single-bit error, the post-correction main body data Y is selected and output and in case of the no-error or the double-bit error, the pre-correction main body data X is selected and output. The word cut-out circuit 6 cuts the partial word access to which has been requested to the memory 20 out of the pre-correction main body data X or the post-correction main body data Y which has been output from the corrected data selection circuit 4 and outputs the cut-out partial word as output data RDT. The acknowledge generation circuit 5 generates an acknowledge signal ACK which indicates a timing that data which is effective for the output data RDT is output on the basis of the error type ERR. When the error type is the single-bit error and that error is corrected by the error correction circuit 3, a time is taken for performing the error correction processing and therefore the post-correction main body data Y is output delayed from the pre-correction main body data X by one cycle. Therefore, when the error type ERR is the single-bit error, the acknowledge generation circuit 5 asserts the acknowledge signal ACK later than assertion of the signal ACK in case of the no-error by one cycle. When the error type ERR is the double-bit error, it is difficult to correct the error. Outputting of each signal in this case is appropriately defined depending on the request from the error processing circuit 10 installed at the rear stage.

Figure 7:
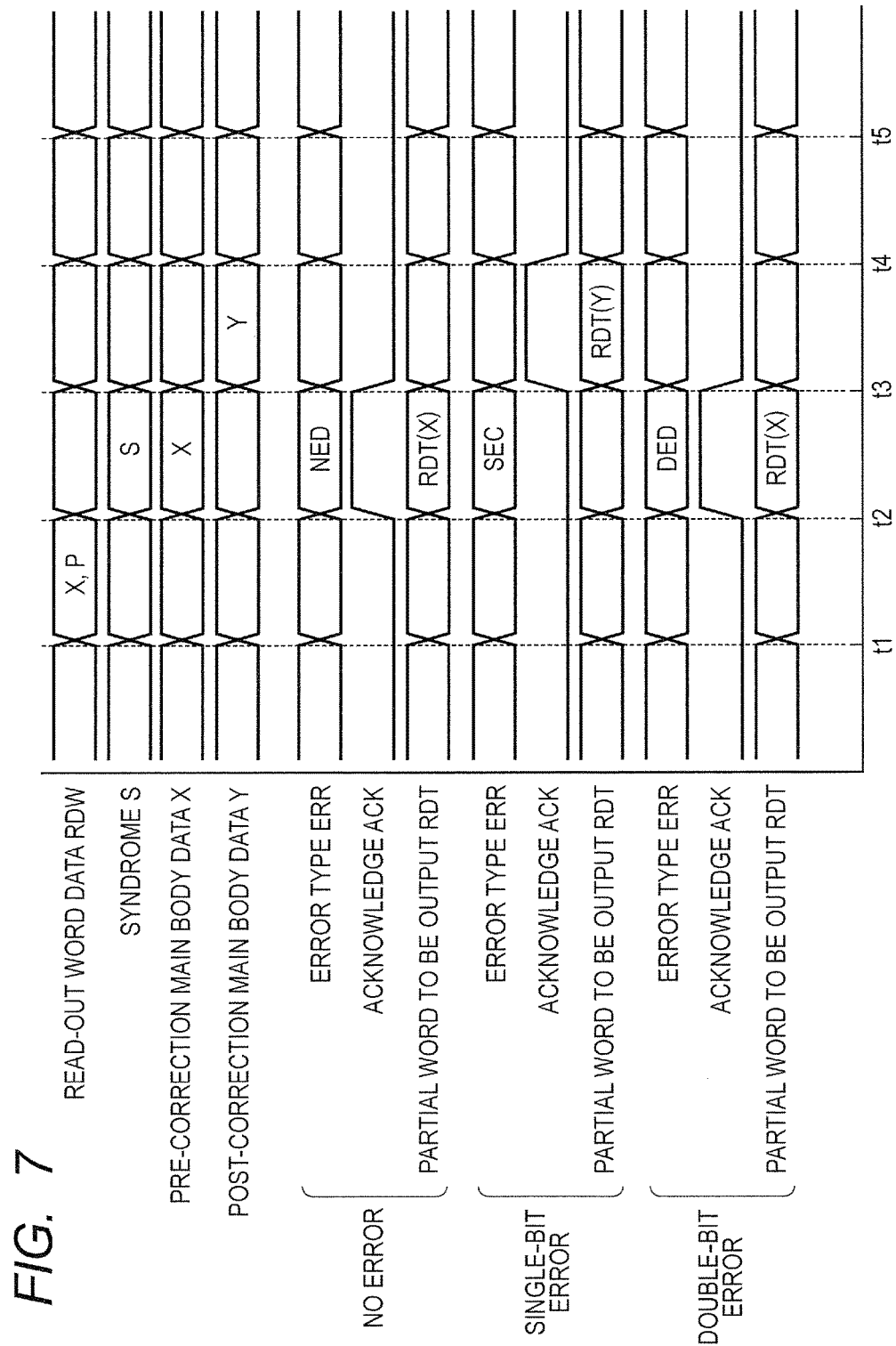
FIG. 7 is a timing chart illustrating one operational example of the error processing circuit in FIG. 5.

FIG. 7 is a timing chart illustrating one operational example of the error processing circuit 10 in FIG. 5. The horizontal axis indicates a time and the times t1 to t5 are indicated with a cycle of a pipeline clock signal to be supplied to the flip-flops 9_1 to 9_3 being set as a unit. In a vertical axis direction, the word data RDW which has been read out of the memory 20, the syndrome S, the pre-correction main body data X and the post-correction main body Y are indicated in this order from top to bottom. Further, the error type ERR, the acknowledge signal ACK and the partial word RDT to be output are respectively indicated for each of the three error types of the no-error, the single-bit error and the double-bit error. Although data in an access cycle to be focused is noted in each waveform by describing the name of a signal concerned, a null cycle may be used by data in another access cycle which is not focused. This point also applies to other timing charts of the embodiments of the present invention.

At the time t1, the word data RDW is read out of the memory 20. The word data RDW includes the main body data X and the ECC additional bits P. The syndrome S which has been generated by the syndrome generation circuit 1 is fetched into the flip-flop 9_2 and is output at the time t2. The main body data X in the read-out word data RDW is supplied to the error correction circuit 3 via the flip-flop 9_1 at the time t2. The corresponding syndrome S is supplied to the error correction circuit 3 also at the time t2, and the error correction circuit 3 executes error correction processing on the main body data X and outputs the post-correction main body data Y via the flip-flop 9_3 at the time t3. The error type decision circuit 2 decides the error type at the time t2 that the syndrome S is supplied thereto and outputs any of the no-error (NED), the single-bit error (SEC) and the double-bit error (DED) as the error type ERR.

In case of the no-error (ERR=NED), the pre-correction main body data X which is output also at the time t2 is selected and output by the corrected data selection circuit 4 and the partial word to be accessed is cut out by the word cut-out circuit 6 and is output as the output data RDT(X). At that time, the acknowledge generation circuit 5 asserts the acknowledge signal ACK also at the time t2.

In case of the single-bit error (ERR=SEC), the post-correction main body data Y which is output at the time t3 which is behind the time t2 by one cycle is selected and output by the corrected data selection circuit 4 and the partial word to be accessed is cut out by the word cut-out circuit 6 and is output as the output data RDT(Y). At that time, the acknowledge generation circuit 5 asserts the acknowledge signal ACK also at the time t3 which is behind the time t2 by one cycle.

In case of the double-bit error (ERR=DED), the pre-correction main body data X which is output also at the time t2 is selected and output by the corrected error selection circuit 4 and the partial word to be accessed is cut out by the word cut-out circuit 6 and is output as the output data RDT(X). At that time, the acknowledge generation circuit 5 asserts the acknowledge signal ACK also at the time t2. That is, regardless of the fact that the error type is decided as the double-bit error (ERR=DED), the pre-correction main body data X which may possibly include the error is output. This is because the double-bit error is beyond the error correcting capability of the error correction circuit 3 and therefore error processing is entrusted to the rear stage. The specification of an output signal to be output in case of the double-bit error (ERR=DED) may be appropriately changed in accordance with the contents of the error processing to be performed at the rear stage.

FIG. 6 is a block diagram illustrating one configurational example of a data processing circuit according to the second embodiment. The data processing circuit according to the second embodiment illustrated in FIG. 6 is configured by coupling the error processing circuit 10 to the memory 20. Similarly to the error processing circuit 10 according to the comparative example illustrated in FIG. 5, the error processing circuit 10 includes the syndrome generation circuit 1, the error type decision circuit 2, the error correction circuit 3, the corrected data selection circuit 4, the acknowledge generation circuit 5, the word cut-out circuit 6, the plurality of flip-flops 9_1 to 9_3 which configure the pipeline and so forth. The error processing circuit 10 further includes a word+parity cut-out circuit 7, a parity decoding circuit 8 and so forth. The data RDW which is readout of the memory 20 is the word data which includes the main body data X and the ECC additional bits P. The whole word data RDW (X, P) which has been read out of the memory 20 is supplied to the syndrome generation circuit 1, the main body data part RDW (X) is supplied to the error correction circuit 3 via the flip-flop 9_1 and the whole word data RDW (X, P) is supplied to the word+parity cut-out circuit 7 in parallel with the above-mentioned operations.

The syndrome S which has been generated by the syndrome generation circuit 1 is supplied to the error type decision circuit 2 and the error correction circuit 3 via the flip-flop 9_2. The error type decision circuit 2 decides what the error type is, the no-error (NED), the single-bit error (SED) or the double-bit error (DED) and outputs the decided error type as the error type ERR. The error correction circuit 3 executes error correction processing on the read-out pre-correction main body data X on the basis of the input syndrome S and outputs the post-correction main body data Y to the word cut-out circuit 6 via the flip-flop 9_3. The word cut-out circuit 6 cuts the partial word which has been requested to the memory 20 out of the post-correction main body data Y and outputs the cut-out partial word to the corrected data selection circuit 4.

The word+parity cut-out circuit 7 cuts the partial word access to which has been requested to the memory 20 and the parity bit corresponding to the partial word out of the supplied word data RDW (X, P) and supplies the partial word and the corresponding parity bit to the parity decoding circuit 8. The cut-out partial word is output to the corrected data selection circuit 4. The parity decoding circuit 8 executes parity decoding on the supplied partial word and parity bit, decides presence/absence of a parity error and outputs a correctable error signal CER. Since, only presence/absence of the parity error is decided here, whether the parity error is actually correctable is to be decided on the basis of the error type ERR which is output from the error type decision circuit 2. However, here, the presence/absence of the parity error is output simply as the correctable error signal CER.

The corrected data selection circuit 4 selects and outputs either the partial word which has been cut out of the post-correction main body data Y or the partial word which has been cut out of the pre-correction main body data X. In the presence of the parity error, the partial word which has been cut out of the post-correction main body data Y is selected and output. In the absence of the parity error, the partial word which has been cut out of the pre-correction main body data X is selected and output.

The acknowledge generation circuit 5 generates the acknowledge signal ACK which indicates the timing that the data which is effective for the output data RDT is output on the basis of the correctable error signal CER. When the parity error has not been detected, the partial word which has been cut out of the pre-correction main body data X is output in the cycle that the data has been readout of the memory 20 and therefore the acknowledge generation circuit 5 asserts the acknowledge signal ACK to the cycle. On the other hand, when the parity error has been detected, the partial word which has been cut out of the post-correction main body data Y is output with a delay of two cycles by waiting till completion of the error correction processing performed by the error correction circuit 3 and therefore the acknowledge generation circuit 5 asserts the acknowledge signal ACK with the delay of two cycles from signal assertion to be performed when the parity error has not been detected.

FIG. 8 is a timing chart illustrating one operational example of the error processing circuit in FIG. 6. The horizontal axis indicates the time and the times t1 to t5 are indicated with the cycle of the pipeline clock signal to be supplied to the flip-flops 9_1 to 9_3 being set as the unit similarly to the example in FIG. 7. In the vertical axis direction, the word data RDW which has been read out of the memory 20, the syndrome S, the pre-correction main body data X, the post-correction main body Y and the error type ERR are indicated in this order from top to bottom. Further, the correctable error signal CER, the acknowledge signal ACK and the partial word RDT to be output are indicated separately for the absence of the parity error and the presence of the parity error.

At the time t1, the word data RDW which includes the main body data X and the ECC additional bits P is read out of the memory 20. The syndrome S which has been generated by the syndrome generation circuit 1 is fetched into the flip-flop 9_2 and is output at the time t2. The main body data X in the read-out word data RDW is supplied to the error correction circuit 3 via the flip-flop 9_1 at the time t2. The corresponding syndrome S is also supplied to the error correction circuit 3 also at the time t2, and the error correction circuit 3 executes the error correction processing on the main body data X and outputs the post-correction main body data Y via the flip-flop 9_3 at the time t3. The error type decision circuit 2 decides the error type at the time t2 that the syndrome S is supplied thereto and outputs any of the no-error (NED), the single-bit error (SEC) and the double-bit error (DED) as the error type ERR. The operations performed so far are the same as the operations of the comparative example illustrated in FIG. 7.

At the time t1 that the word data RDW is read out of the memory 20, the word+parity cut-out circuit 7 cuts out the partial word and the parity bit which corresponds to the partial word and supplies the cut-out partial word and corresponding parity bit to the parity decoding circuit 8. The cut-out partial word is output to the corrected data selection circuit 4. The parity decoding circuit 8 executes parity decoding on the supplied partial word and parity bit, decides presence/absence of the parity error and outputs the correctable error signal CER. Since the word+parity cut-out circuit 7 is a simple circuit which is configured so as to simply select the partial word and the parity bit from the word data RDW and the parity decoding circuit 8 may have a high-speed circuit configuration which is reduced in number of delay stages because the object to be decoded is the partial word which is one several of the word data RDW in data size, it is possible to execute parity decoding in a cycle which is the same as the cycle in which the word data RDW is read out of the memory 20.

In the absence of the parity error (CER=0), the partial word which has been cut out of the pre-correction main body data X which is output at the time t1 is selected by the corrected data selection circuit 4 and is output as the output data RDT (X). In the presence of the parity error (CER=1), the partial word which has been cut out of the post-correction main body data Y which is output at the time t3 is selected by the corrected data selection circuit 4 and is output as the output data RDT (Y).

Even when the absence of the parity error (CER=0) in the partial word has been decided, it may not necessarily mean that there is no error (ERR=NED) in the word data RDW. There is the possibility that an error may be generated in a part other than the partial word concerned and there is also the possibility that the double-bit error may be generated in the partial word concerned. Therefore, the output data RDT (X) which has been output at the time t1 as mentioned above may not necessarily be the partial data which has been cut out of the word data with no error. However, since a probability that the error is actually generated is low, the access cycle of the memory 20 is improved by using the data obtained when there is no parity error as the output data RDT at the rear stage. Comparing the example in FIG. 7 with the example in FIG. 8, it is found that the data is output earlier by one cycle in the example in FIG. 8. On the other hand, since the correct error type ERR which is decided on the basis of the syndrome S is output at the time t2 as mentioned above, appropriate processing is performed on the output data RDT (X) which has been once output at the time t1 on the basis of a result of decision of the correct error type ERR at the rear stage. For example, in case of the single-bit error (ERR=SEC), the output data RDT(X) which has been once output is invalidated and is replaced with the output data RDT (Y) configured by the partial word which has been cut out of the post-correction main body data Y. In case of the double-bit error (ERR=DED), the flow shifts to appropriate error processing.

In the actual circuit operation, no error is generated inmost cases, generation of the single-bit error is rare and the generation of the double-bit error is rarer than the generation of the single-bit error. Accordingly, since the average access speed of the memory 20 is predominantly defined depending on the delay when there is no error, it is possible to improve the access performance of the memory 20 as a whole.

Incidentally, the pipeline configuration which has been described in the second embodiment is merely one example and may be appropriately changed in consideration of a circuit delay which would occur at each pipeline stage and the timing charts illustrated in FIG. 7 and FIG. 8 may be changed depending on a result of changing of the pipeline configuration.

One concrete configurational example of the error processing circuit 10 will be described. For easy understanding, description will be made on the assumption that the main body data is configured by nine bits and each partial word is configured by three bits. The number of bits which configures each of the main body data and each partial word is merely one example and may be optionally changed.

FIG. 9 is an explanatory diagram illustrating one example of a method of generating the ECC additional bits included in the word data which is input into the error processing circuit 10 in FIG. 5 according to the comparative example. The five ECC additional bits p0 to p4 are generated by multiplying the 9-bit main body data d0 to d8 by a generation matrix of five rows×nine columns. The generation matrix used here is a generation matrix of the extended Hamming code that the columns of the generation matrix are mutually different and each column is configured by the odd number of "1s".

FIG. 10 is an explanatory diagram illustrating one example of a method of generating the syndromes in the error processing circuit 10 in FIG. 5. The syndromes s0 to s4 are generated by multiplying the word data x0 to x8 and p0 to p4 read out of the memory 20 by a check matrix of five rows×fourteen columns. The check matrix is configured by conjoining together the above-mentioned generation matrix of five rows×nine columns and a unit matrix of five rows×five columns. The syndrome generation circuit 1 in FIG. 5 generates the syndromes s0 to s4 in accordance with this multiplication formula.

FIG. 11 is an explanatory diagram illustrating one example of a method of generating the ECC additional bits included in the word data to be input into the error processing circuit 10 in FIG. 6 according to the second embodiment. The six ECC additional bits p0 to p5 are generated by multiplying the 9-bit main body data d0 to d8 by a generation matrix of six rows×nine columns. The generation matrix used here is the generation matrix of the extended Hamming code that the columns of the generation matrix are mutually different and each column is configured by the odd number of "1s" and at the same time includes apart for generating each partial word parity code. That is, in the fourth row of the generation matrix, the first to third columns corresponding to the bits d0 to d2 of the first partial word are "1s", other columns are "0s" and the parity p3 which is generated by the fourth row configures the parity code for the first partial word d0 to d2. Likewise, in the fifth row of the generation matrix, the fourth to sixth columns corresponding to the bits d3 to d5 of the second partial word are "1s", other columns are "0s" and the parity p4 which is generated by the fifth row configures the parity code for the second partial word d0 to d2. In addition, in the sixth row of the generation matrix, the seventh to ninth columns corresponding to the bits d6 to d8 of the third partial word are "1s", other columns are "0s" and the parity p5 which is generated by the sixth row configures the parity code for the third partial word d6 to d8.

FIG. 12 is an explanatory diagram illustrating one example of a method of generating the syndromes in the error processing circuit 10 in FIG. 6 according to the second embodiment. The syndromes s0 to s5 are generated by multiplying the word data x0 to x8 and p0 to p5 read out of the memory 20 by a check matrix of six rows×fifteen columns. The check matrix is configured by conjoining together the above-mentioned generation matrix of six rows×nine columns and a unit matrix of six rows×six columns. The syndrome generation circuit 1 in FIG. 6 generates the syndromes s0 to s5 in accordance with this multiplication formula.

Since the bits p3 to p5 in the ECC additional bits p0 to p5 respectively configure the parity codes for the first to third partial words as described above, it is possible to execute parity check of each partial word in parallel with execution of the above-mentioned syndrome generation and subsequent error type decision processing and error correction processing.

Figure 13:
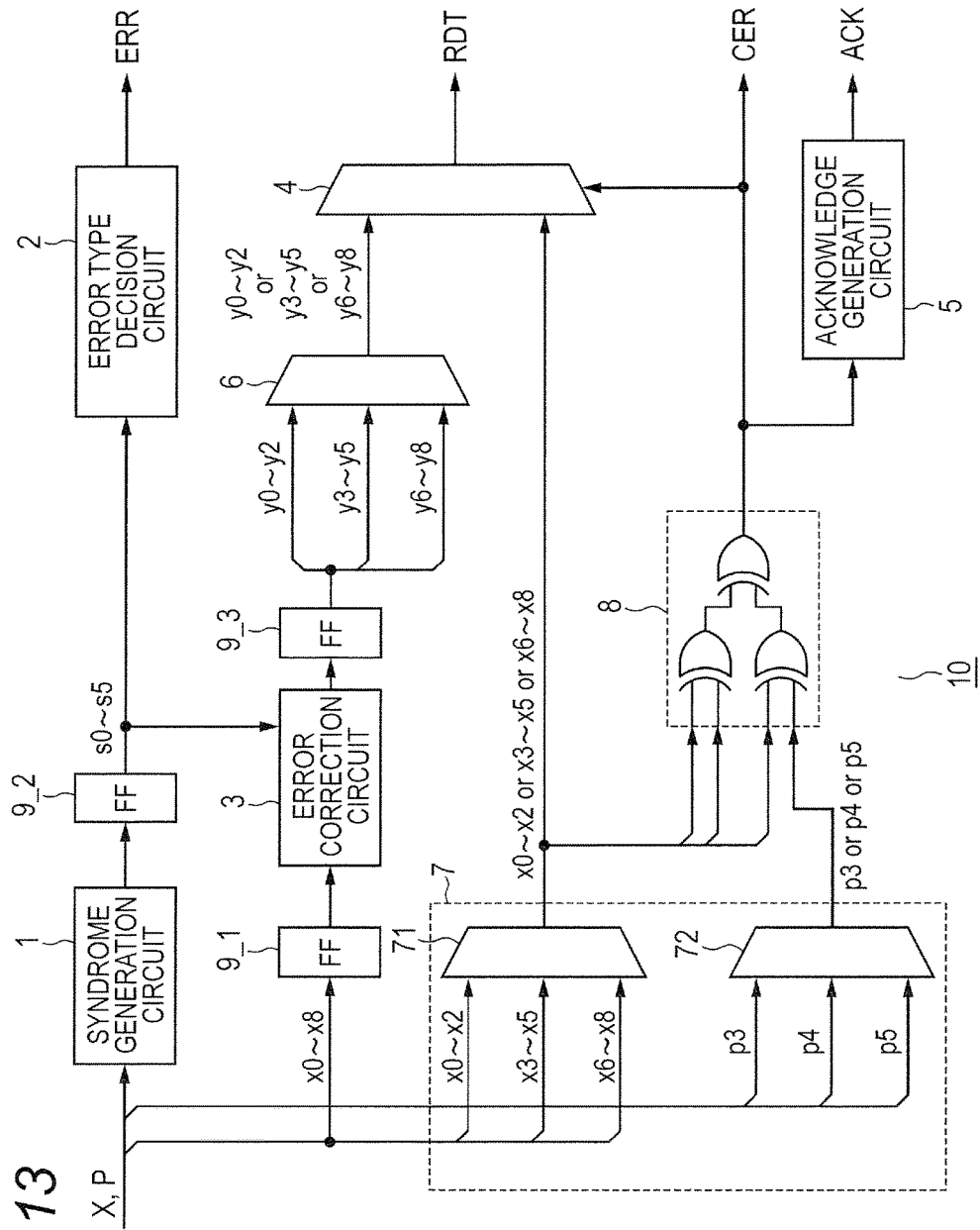
FIG. 13 is a block diagram illustrating one more detailed configurational example of the error processing circuit in FIG. 6 according to the second embodiment.

FIG. 13 is a block diagram illustrating one more detailed configurational example of the error processing circuit 10 in FIG. 6.

The pre-correction main body data X (x0 to x8) and the ECC additional bit P (p0 to p5) which have been read out of the memory 20 are input into the error processing circuit 10. the whole read-out word data (x0 to x8 and p0 to p5) is input into the syndrome generation circuit 1 and the main body data x0 to x8 is input into the error correction circuit 3 via the flip-flop 9_1.

The syndromes s0 to s5 which have been generated by the syndrome generation circuit 1 are supplied to the error type decision circuit 2 and the error correction circuit 3 via the flip-flop 9_2. The error type decision circuit 2 decides what the error type is, the no-error (NED), the single-bit error (SED) or the double-bit error (DED) and outputs the decided error type as the error type ERR. The error correction circuit 3 executes error correction processing on the read-out pre-correction main body data x0 to x8 on the basis of the input syndromes s0 to s5 and outputs post-correction main body data y0 to y8 to the word cut-out circuit 6 via the flip-flop 9_3. The word cut-out circuit 6 cuts a partial word y0 to y2 or y3 to y5 or y6 to y8 access to which has been requested to the memory 20 out of the post-correction main body data y0 to y8 and outputs the cut-out partial word to the corrected data selection circuit 4.

The word+parity cut-out circuit 7 is configured by a selector 71 for cutting the partial concerned word out of the main body data x0 to x8 and a selector 72 for cutting the corresponding parity bit out of the ECC additional bits p0 to p5. The selector 71 cuts the partial word x0 to x2 or x3 to x5 or x6 to x8 access to which has been requested to the memory 20 out of the main body data x0 to x8 and outputs the cut-out partial word to the corrected data selection circuit 4 and the parity decoding circuit 8. The selector 72 cuts the parity bit p3 or p4 or p5 which corresponds to the above-mentioned partial word out of the ECC additional bits p0 to p5 and outputs the cut-out parity bit to the parity decoding circuit 8. The parity decoding circuit 8 executes parity decoding on the supplied partial word and parity bit, decides presence/absence of the parity error and outputs the correctable error signal CER.

The corrected data selection circuit 4 selects and outputs either the partial word which has been cut out of the post-correction main body data Y or the partial word which has been cut out of the pre-correction main body data X on the basis of the correctable error signal CER. In the presence of the parity error, the partial word which has been cut out of the post-correction main body data Y is selected and output. In the absence of the parity error, the partial word which has been cut out of the pre-correction main body data X is selected and output.

The acknowledge generation circuit 5 generates the acknowledge signal ACK which indicates the timing that the data which is effective for the output data RDT is output on the basis of the correctable error signal CER.

In this way, the whole 9-bit data x0 to x8 and the five ECC additional bits p0 to p5 which have been read out of the memory 20 and amount to fifteen bits in total are input into the syndrome generation circuit 1 and thereby the syndrome generation circuit 1 generates the syndromes s0 to s5 configured by six bits. In contrast, in parity check performed for every partial word, four bits in total configured by three bits for the partial word and one parity bit are input into the parity decoding circuit 8 via one stage of the selector 71 or 72 in the word+parity cut-out circuit 7 and thereby the correctable error signal CER is generated. Accordingly, it is possible to greatly reduce the circuit delay in comparison with the syndrome generation circuit 1 into which fifteen bits are input in total. Thereby, absence of the parity error is decided at a high speed and thereby it is possible to increase the average access speed of the memory 20 which is attained by taking an error generation probability into consideration.

In the second embodiment, the configuration that the parity decoding circuit 8 is operated in time division has been illustrated. As an alternative, the parity decoding circuit 8 may be provided for every partial word and the parity decoding circuits 8 so provided may be operated in parallel with one another.

Figure 19:
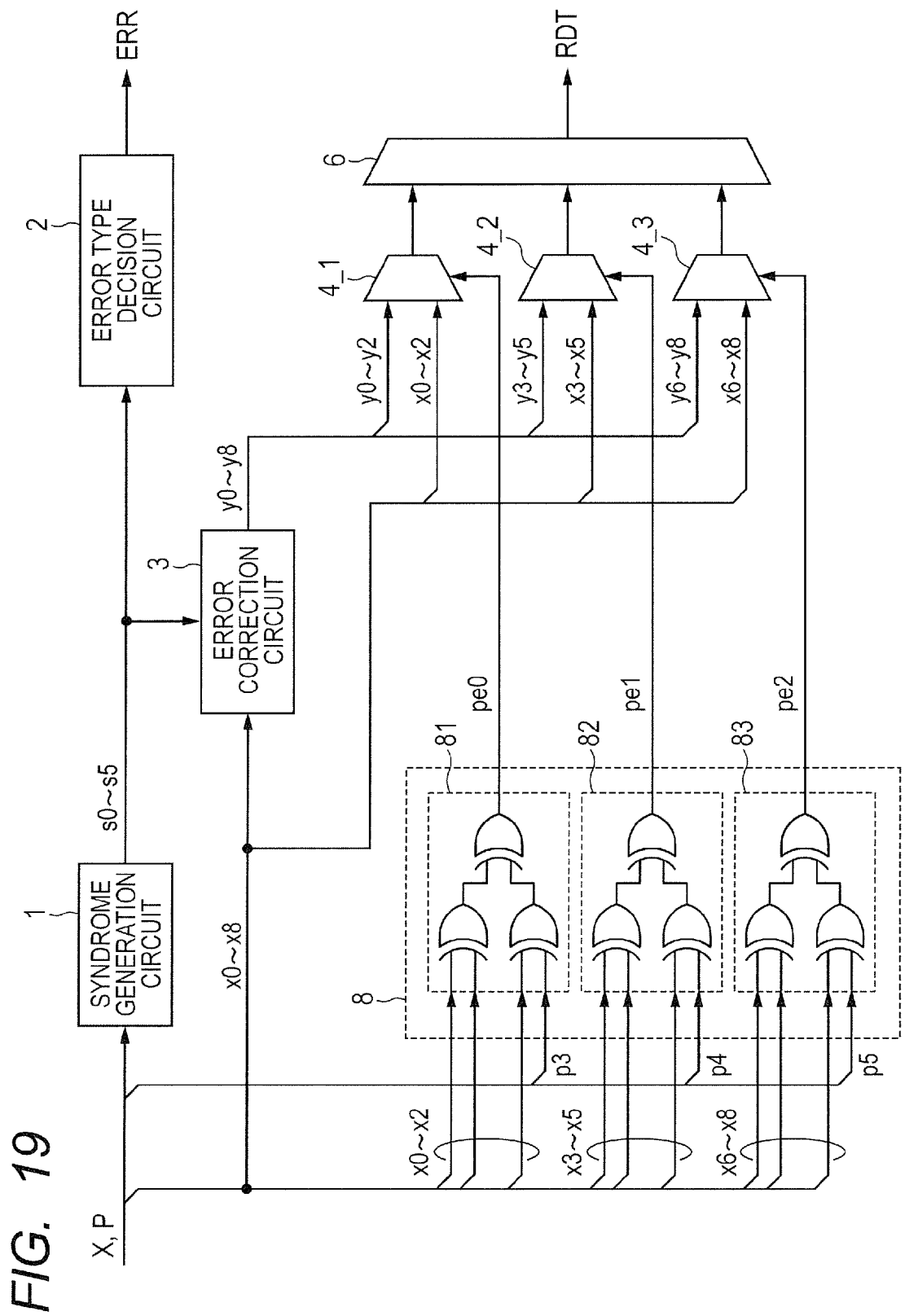
FIG. 19 is a block diagram illustrating an altered example of the error processing circuit in FIG. 14.

FIG. 19 is a block diagram illustrating one altered example of the error processing circuit 10 illustrated in FIG. 13. In FIG. 19, illustration of the plurality of flip-flops and the acknowledge generation circuit 5 is omitted. As the parity decoding circuit 8, three parity decoding circuits 81 to 83 are arranged in parallel with one another for every partial word and respectively output results of decoding pe0 to pe2. Since the whole data x0 to x8 and the ECC additional bits p0 to p5 which have been read out of the memory 20 are input into the parity decoding circuit 8, the word+parity cut-out circuit 7 becomes useless and therefore is omitted. For selection of the corrected data, three corrected data selection circuits 4_1 to 4_3 are arranged in parallel with one another for every partial word. The word cut-out circuit 6 is installed at the rear stage of the three corrected data selection circuits 4_1 to 4_3.

Third Embodiment

<Word Cutting-Out Before Error Correction>

Another detailed embodiment will be described.

FIG. 14 is a block diagram illustrating one configurational example of a data processing circuit according to the third embodiment. The data processing circuit according to the third embodiment illustrated in FIG. 14 is configured by coupling the error processing circuit 10 to the memory 20 similarly to the data processing circuit according to the second embodiment illustrated in FIG. 6. The data processing circuit according to the third embodiment is the same as the data processing circuit according to the second embodiment in the point that the error processing circuit 10 includes the syndrome generation circuit 1, the error type decision circuit 2, the error correction circuit 3, the corrected data selection circuit 4, the acknowledge generation circuit 5, the word cut-out circuit 6, the word+parity cut-out circuit 7, the parity decoding circuit 8, the plurality of flip-flops and so forth. However, the data processing circuit according to the third embodiment is different from the data processing circuit according to the second embodiment in the point that the word cut-out circuit 6 is arranged at a front stage of the error correction circuit 3. The word cut-out circuit 6 cuts the partial word access to which has been requested to the memory 20 out of the main body data X of the data RDW which is read out of the memory 20 and supplies the cut-out partial word to the error correction circuit 3. Since the error correction circuit 3 is a circuit of the type for performing error correction processing not on the whole main body data X but on the cut-out partial word, the circuit delay is small. Therefore, also the arrangement of the flip-flops which configure the pipeline is changed. That is, the flip-flop 9_3 which is arranged at the front stage of the error correction circuit 3 in FIG. 6 is omitted and a flip-flop 9_4 is arranged at the rear stage of the error correction circuit 3 in place of the flip-flop 9_3. In association with provision of the flip-flop 9_4, the flip-flop 9_2 for the syndrome S is shifted to a stage behind a junction through which data is input into the error correction circuit 3. While the data processing circuit according to the third embodiment is greatly different from the data processing circuit according to the second embodiment in the point that the error correction circuit 3 which executes error correction processing on the partial word is provided as mentioned above, the data processing circuit according to the third embodiment operates in the same manner as the data processing circuit according to the second embodiment excepting that the pipeline structure is slightly changed in association with provision of the flip-flop 9_4 and the error correction circuit 3. Although description on the configurations and the operations which are the same as those of the second embodiment is omitted, in the following, the operation of the error processing circuit 10 according to the third embodiment will be described focusing on the different points.

In the error correction code algorithm such as the SECDED and so forth, in general, the object to be subjected to the error correction processing is limited to the whole main body data and it is difficult to set only part of the main body data as the object to be subjected to the error correction processing. In the third embodiment, a generation matrix which implements partial error correction of the main body data is adopted.

FIG. 15 is an explanatory diagram illustrating one example of a method of generating the ECC additional bits according to the third embodiment. Similarly to the second embodiment illustrated in FIG. 11, the six ECC additional bits p0 to p5 are generated by multiplying the 9-bit main body data d0 to d8 by the generation matrix of six rows×nine columns. The third embodiment is the same as the second embodiment in the points that the generation matrix used is the generation matrix of the extended Hamming code that the columns of the generation matrix are mutually different and each column is configured by the odd number of "1s" and the part for generating each partial word parity code is included. The third embodiment is different from the second embodiment in the point that elements of a part other than the part for generating each partial word parity code are configured by partial matrixes which are the same as one another for every plurality of columns corresponding to the respective partial words. That is, the following respective partial matrixes are made the same as one another.

In the first to third columns corresponding to the first partial word, the partial matrix of three rows×three columns corresponding to parts other than the fourth to sixth rows for generating each partial word parity code.

In the fourth to sixth columns corresponding to the second partial word, the partial matrix of three rows×three columns corresponding to parts other than the fourth to sixth rows for generating each partial word parity code.

In the seventh to ninth columns corresponding to the third partial word, the partial matrix of three rows×three columns corresponding to parts other than the fourth to sixth rows for generating each partial word parity code.

Even such a generation matrix still satisfies the condition that "the respective columns are mutually different and each column is configured by the odd number of "1s" which is demanded for the generation matrix of the extended Hamming code.

FIG. 16 is an explanatory diagram illustrating one example of a method of generating the syndromes according to the third embodiment. Although the check matrix is also changed in association with change of the generation matrix as mentioned above, the check matrix satisfies the condition which is demanded for the extended Hamming code and therefore it is possible to generate the syndromes s0 to s5 conforming to the algorithm of the extended Hamming code and it is also possible to similarly perform error correction processing using the syndromes. In addition, the syndromes s0 to s5 configure the partial word parity code corresponding to the each partial word.

The generated syndromes s0 to s5 are used to decide the error type. When all of the syndromes s0 to s5 are "0s", it is decided that there is no error. The syndromes s0 to s5 are compared with each column of the part corresponding to the generation matrix in the check matrix, when there exists a column which matches the syndromes, it is decided that the single-bit error is generated and when there exists no column which matches the syndromes, it is decided that the double-bit error is generated and no correction is made on the error. No decision is made on the errors of three or more bits.

In the third embodiment, the syndromes s0 to s2 which are other than the syndromes s3 to s5 and configure the partial word parity code are compared with each column of the part corresponding to the generation matrix in the first to third rows. That is, the syndromes s0 to s2 are compared with the first to ninth columns in the first to third rows. Here, as described with reference to FIG. 15, since in the first to third rows, the partial matrix in the first to third columns, the partial matrix in the fourth to sixth columns and the partial matrix in the seventh to ninth columns are the same as one another, it is enough to compare the syndromes s0 to s2 with three sets of column data. The three sets of column data are the column data of the first, fourth and seventh columns, the column data of the second, fourth and eighth columns and the column data of the third, sixth and ninth columns.

In the error correction processing of the extended Hamming code, since the number of the column which matches the syndromes s0 to s5 corresponds to the number of the bit position of the information bit that the error has been generated, the error is corrected by inverting data of the corresponding bit position of the data x0 to x8 read out of the memory 20 and thereby the information bits d0 to d8 are restored. In contrast, in the third embodiment, the column which matches the syndromes s0 to s2 is the column data of the first, fourth and seventh columns, the column data of the second, fourth and eighth columns or the column data of the third, sixth and ninth columns.

On the other hand, in the main body data x0 to x8 read out of the memory 20, the partial word x0 to x2, x3 to x5 or x6 to x8 which has been cut out by the word cut-out circuit 6 is input into the error correction circuit 3. When the syndromes s0 to s2 match the column data of the first, fourth and seventh columns, the first bit x0, x3 or x6 is corrected regardless of which partial word is input. When the syndromes s0 to s2 match the column data of the second, fifth and eighth columns, the second bit x1, x4 or x7 is corrected regardless of which partial word is input. When the syndromes s0 to s2 match the column data of the third, sixth and ninth columns, the third bit x2, x5 or x8 is corrected regardless of which partial word is input.

The partial word y0 to y2, y3 to y5 or y6 to y8 which has been corrected in this way is input into the corrected data selection circuit 4 via the flip-flop 9_4. The partial word x0 to x2, x3 to x5 or x6 to x8 which has been cut out of the pre-correction main body data X is input into the other side of the corrected data selection circuit 4 in advance. The corrected data selection circuit 4 selects and outputs either the partial word (y0 to y2, y3 to y5 or y6 to y8) which has been cut out of the post-correction main body data Y or the partial word (x0 to x2, x3 to x5 or x6 to x8) which has been cut out of the pre-correction main body data X on the basis of the correctable error signal CER. In the presence of the parity error, the partial word (y0 to y2, y3 to y5 or y6 to y8) which has been cut out of the post-correction main body data Y is selected and output. In the absence of the parity error, the partial word (x0 to x2, x3 to x5 or x6 to x8) which has been cut out of the pre-correction main body data X is selected and output.

The configuration of the error processing circuit 10 according to the third embodiment will be described in more detail.

Figure 17:
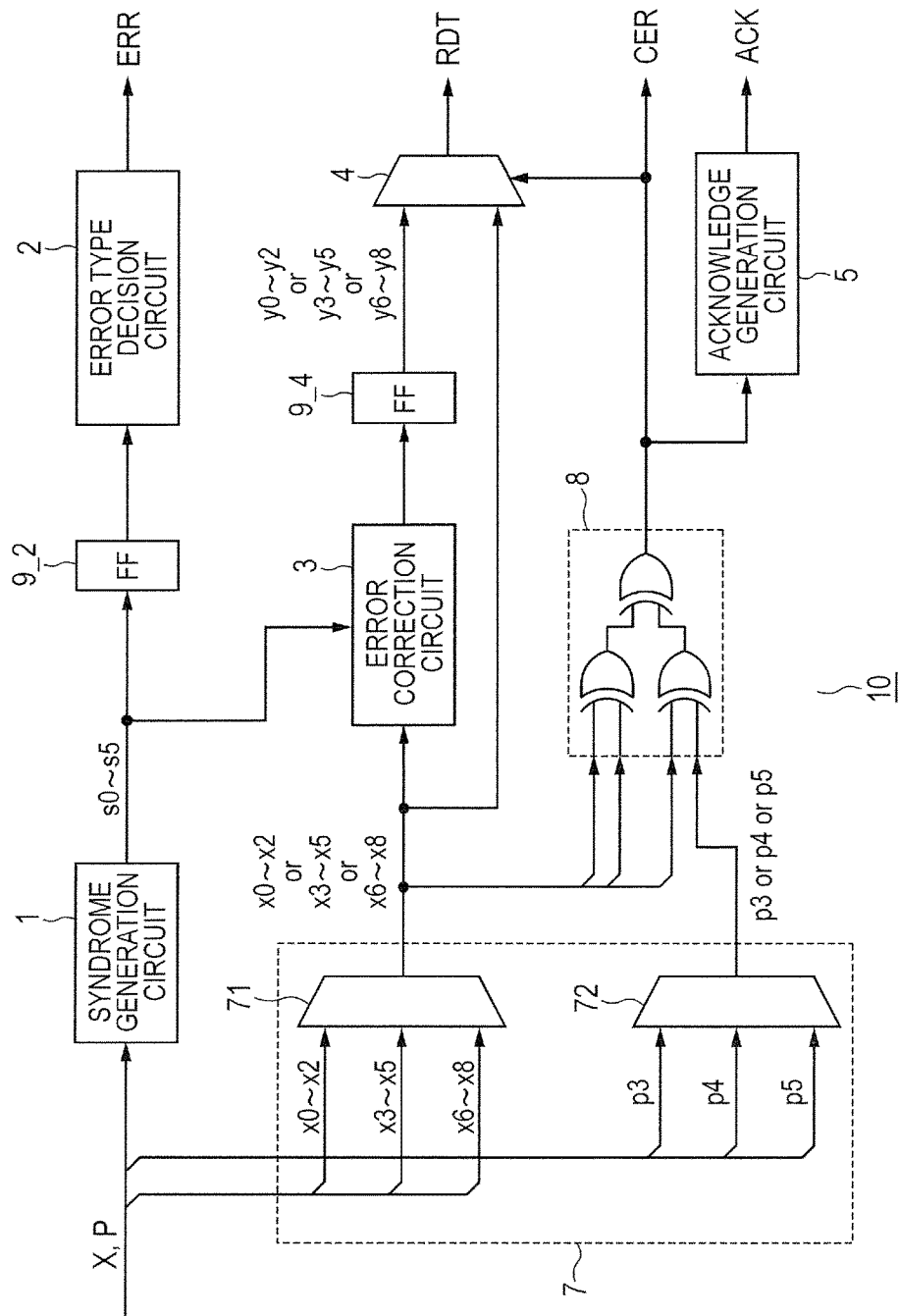
FIG. 17 is a block diagram illustrating one more detailed configurational example of the error processing circuit in FIG. 14.

FIG. 17 is a block diagram illustrating one more detailed configurational example of the error processing circuit 10 in FIG. 14.

The pre-correction main body data X (x0 to x8) and the ECC additional bits P (p0 to p5) which have been read out of the memory 20 are input into the error processing circuit 10. The whole word data (x0 to x8 and p0 to p5) is input into the syndrome generation circuit 1 and the word+parity cut-out circuit 7. The syndrome generation circuit 1 generates the syndromes s0 to s5 and supplies the generated syndromes s0 to s5 to the error correction circuit 3. In addition, the syndrome generation circuit 7 supplies the syndromes s0 to s5 also to the error type decision circuit 2 via the flip-flop 9_2. The error type decision circuit 2 decides what the error type is, the no-error (NED), the single-bit error (SEC) or the double-bit error (DED) and outputs the decided error type as the error type ERR.

The word+parity cut-out circuit 7 is configured by the selector 71 for cutting the partial word concerned out of the main body data x0 to x8 and the selector 72 for cutting the corresponding parity bit out of the ECC additional bits p0 to p5. The selector 71 cuts the partial word x0 to x2 or x3 to x5 or x6 to x8 access to which has been requested to the memory 20 out of the main body data x0 to x8 and outputs the cut-out partial word to the error correction circuit 8, the corrected data selection circuit 4 and the parity decoding circuit 8. The selector 72 cuts the parity bit p3 or p4 or p5 corresponding to the above-mentioned partial word out of the ECC additional bits p0 to p5 and outputs the cut-out parity bit to the parity decoding circuit 8. Although the word cut-out circuit 6 is illustrated in FIG. 14, the selector 71 included in the word+parity cut-out circuit 7 has the same function as the word cut-out circuit 6 in the example in FIG. 17 and therefore the output from the selector 71 is applied instead. The parity decoding circuit 8 executes parity decoding on the supplied partial word and parity bit, decides presence/absence of the parity error and outputs the correctable error signal CER.

The error correction circuit 3 executes the above-mentioned error correction processing on the partial word x0 to x2, x3 to x5 or x6 to x8 which has been cut out of the pre-correction main body data X on the basis of the input syndromes s0 to s5 and outputs the corrected partial word y0 to y2, y3 to y5 or y6 to y8. The corrected partial word y0 to y2, y3 to y5 or y6 to y8 is input into the corrected data selection circuit 4 via the flip-flop 9_4.

The corrected data selection circuit 4 selects and outputs either the partial word (y0 to y2, y3 to y5 or y6 to y8) which has been cut out of the post-correction main body data Y or the partial word (x0 to x2, x3 to x5 or x6 to x8) which has been cut out of the pre-correction main body data X on the basis of the correctable error signal CER. In the presence of the parity error, the partial word (y0 to y2, y3 to y5 or y6 to y8) which has been cut out of the post-correction main body data Y is selected and output. In the absence of the parity error, the partial word (x0 to x2, x3 to x5 or x6 to x8) which has been cut out of the pre-correction main body data X is selected and output.

The acknowledge generation circuit 5 generates the acknowledge signal ACK indicating the timing that the data which is effective for the output data RDT is output on the basis of the correctable error signal CER.

Figure 18:
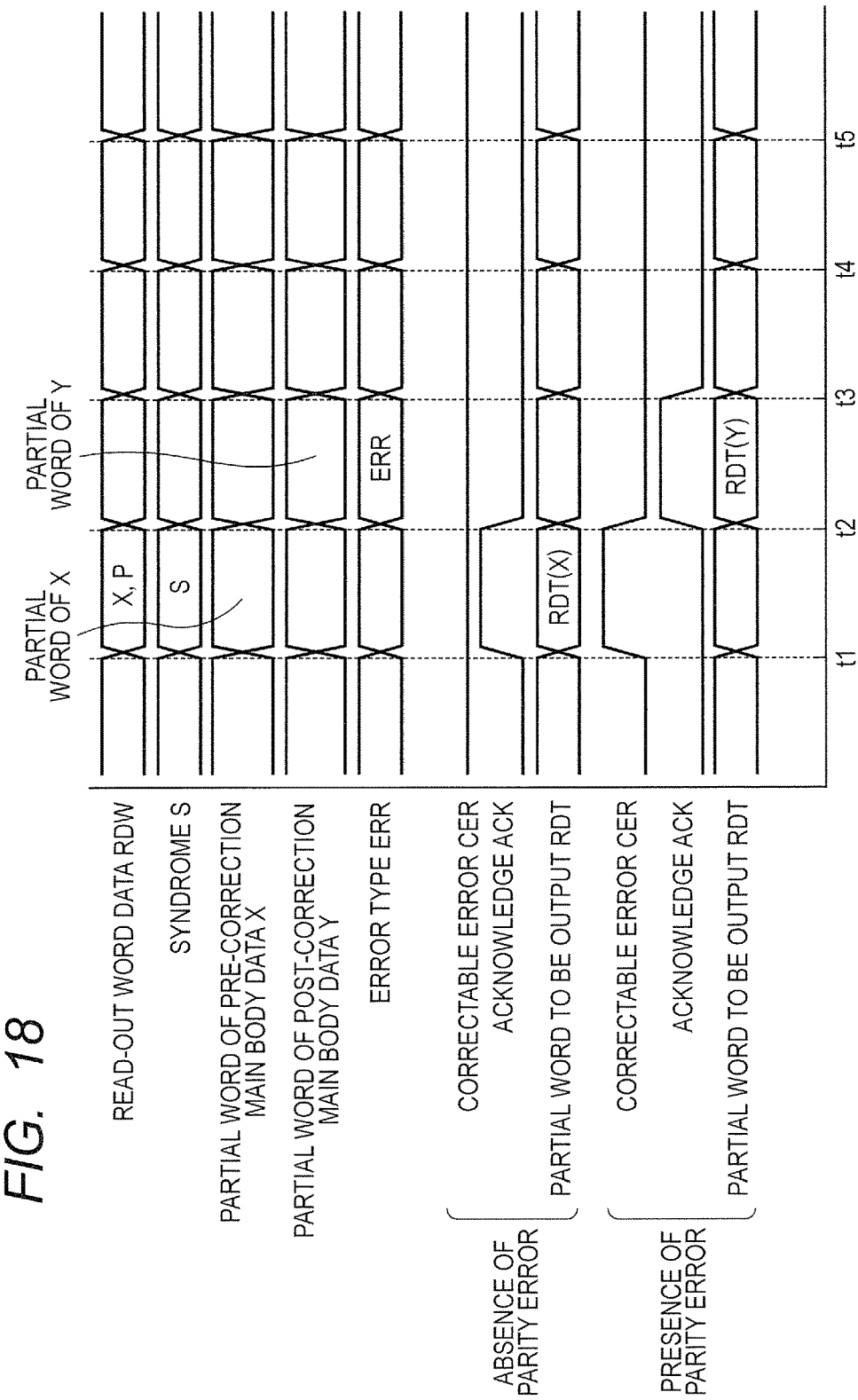
FIG. 18 is a timing chart illustrating one operational example of the error processing circuit in FIG. 14.

FIG. 18 is a timing chart illustrating one operational example of the error processing circuit 10 in FIG. 14. Similarly to the timing chart in FIG. 8, the horizontal axis indicates the time and the times t1 to t5 are indicated with the cycle of the pipeline clock signal to be supplied to the flip-flops 9_1, 9_2 and 9_4 being set as the unit. In the vertical axis direction, the word data RDW read out of the memory 20, the syndrome S, the pre-correction main body data X, the post-correction main body Y and the error type ERR are indicated in this order from top to bottom. Further, the correctable error signal CER, the acknowledge signal ACK and the partial word RDT to be output are indicated separately for the absence of the parity error and the presence of the parity error.

At the time t1, the word data RDW which includes the main body data X and the ECC additional bits P is read out of the memory 20. The syndrome S which has been generated by the syndrome generation circuit 1 is directly supplied to the error correction circuit 3 with no intervention of the flip-flop 9_2. Also at the time t1, the partial word (x0 to x2, x3 to x5 or x6 to x8) which has been cut out of the main body data X in the read-out word data RDW is supplied to the error correction circuit 3. The error correction circuit 3 executes error correction processing on the partial word and outputs the corrected partial word (y0 to y2, y3 to y5 or y6 to y8) to the corrected data selection circuit 4 via the flip-flop 9_4 at the time t2.

At the time t2, the syndrome S is supplied to the error type decision circuit 2 via the flip-flop 9_2, the error type decision circuit 2 decides the error type and outputs any of the no-error (NED), the single-bit error (SEC) and the double-bit error (DED) as the error type ERR.

At the time t1 that the word data RDW is read out of the memory 20, the word+parity cut-out circuit 7 cuts out the partial word and the parity bit which corresponds to the partial word and supplies the partial word and the corresponding parity bit to the parity decoding circuit 8. The cut-out partial word is output to the corrected data selection circuit 4. The parity decoding circuit 8 executes parity decoding on the supplied partial word and parity bit, decides presence/absence of the parity error and outputs the correctable error signal CER.

In the absence of the parity error (CER=0), the partial word (x0 to x2, x3 to x5 or x6 to x8) which has been cut out of the pre-correction main body data X which is output at the time t1 is selected by the corrected data selection circuit 4 and is output as the output data RDT (X). In the presence of the parity error (CER=1), the partial word (y0 to y2, y3 to y5 or y6 to y8) which has been cut out of the post-correction main body data Y which is output at the time t2 is selected by the corrected data selection circuit 4 and is output as output data RDT (Y).

In the third embodiment, since the error correction circuit 3 executes the error correction processing targeting only on the partial word, the delay which would occur is small and the circuit scale is also small. Accordingly, as illustrated in FIG. 14, FIG. 17 and FIG. 18, it is possible to output the correction result earlier than that in the case in the second embodiment illustrated in FIG. 6, FIG. 8 and FIG. 13 by one cycle. Although the example that the main body data is configured by nine bits and each partial word is configured by three bits is illustrated in each drawing, it is also possible to reduce the circuit delay of the error correction circuit 3 and to reduce the circuit scale thereof similarly also when the number of bits of the main body data and/or the number of bits of each partial word have/has been changed.

Although in the third embodiment, the configuration that the error correction circuit 3 is operated in time division is illustrated, it is also possible to arrange the error correction circuit 3 for executing the error correction processing targeting on the partial word for every partial word and to operate the error correction circuits 3 so arranged in parallel with one another.

Figure 20:
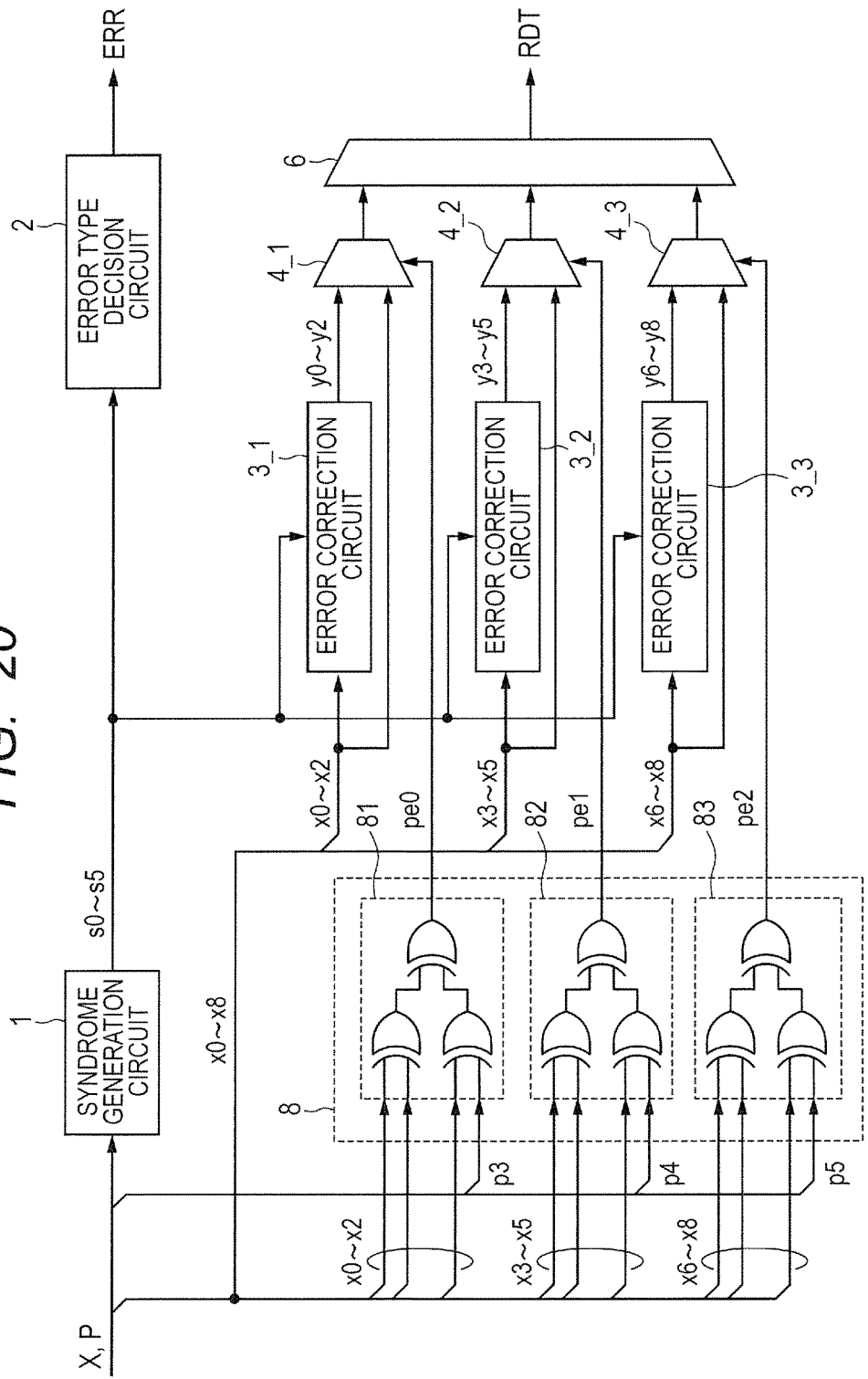
FIG. 20 is a block diagram illustrating an altered example of the error processing circuit in FIG. 17.

FIG. 20 is a block diagram illustrating an altered example of the error processing circuit 10 illustrated in FIG. 17. Illustration of the plurality of flip-flops and the acknowledge generation circuit 5 is omitted. Similarly to the example in FIG. 19, the word+parity cut-out circuit 7 is omitted. In the parity decoding circuit 8, three parity decoding circuits 81 to 83 are arranged in parallel with one another for every partial word and respectively output decoding results pe0 to pe2. In addition, three error correction circuits 3_1 to 3_3 are arranged, respectively execute the error correction processing targeting on their corresponding partial words in parallel with one another and output the corrected partial words y0 to y2, y3 to y5 and y6 to y8. Three corrected data selection circuits 4_1, 4_2 and 4_3 are arranged in parallel with one another, respectively select either the pre-correction partial words or the post-correction partial words on the basis of the parity decoding results pe0 to pet and output the selected partial words to the word cut-out circuit 6 which is arranged at the rear stage.

Fourth Embodiment

<System that Bus Data is Protected with the Parity Code>

It is possible to load the memory 20 and the error processing circuit 10 described in the above-mentioned first to third embodiments on a system that bus data is protected with the parity code. The memory 20 and the error processing circuit 10 described in the first to third embodiments each hold therein a signal of the parity code for each partial word. Therefore, it is possible to output the parity code signal held therein as it is to the bus when coupling to the bus with the parity being added by making the bit length of each partial word match the bus width.

Figure 21:
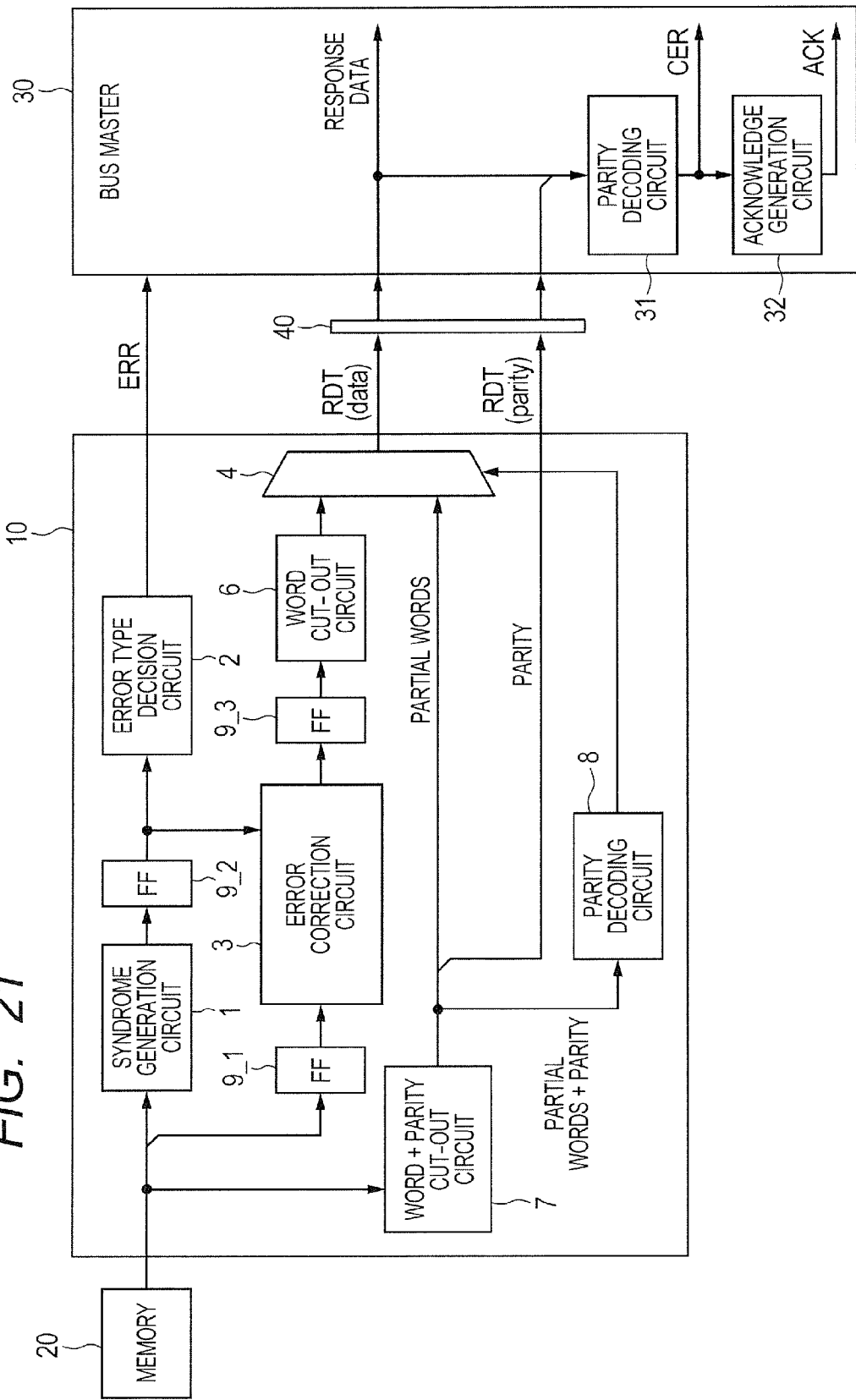
FIG. 21 is a block diagram illustrating one configurational example when the memory and the error processing circuit according to the second embodiment are loaded on a system that bus data is protected with a parity code.

FIG. 21 is a block diagram illustrating one configurational example when the memory 20 and the error processing circuit 10 according to the second embodiment are loaded on the system that the bus data is protected with the parity code. The configuration of the error processing circuit 10 is different from the configuration of the error processing circuit 10 illustrated in FIG. 6 according to the second embodiment in the points that the acknowledge generation circuit 5 is omitted, outputting of the correctable error signal CER and the acknowledge signal ACK is omitted and the parity RDT (parity) corresponding to the partial word is output. Since other configurations and operations in the error processing circuit 10 are the same as those of the error processing circuit 10 in FIG. 6, description thereof is omitted. The partial word RDT (data) and the corresponding parity RDT (parity) that the error processing circuit 10 outputs are output to a read bus 40 and are input into a bus muster 30 together with the error type ERR. The bus master 30 includes a parity decoding circuit 31, an acknowledge generation circuit 32 and so forth and generates by itself the correctable error signal CER and the acknowledge signal ACK on the basis of the partial word RDT (data) and the corresponding parity RDT (parity) which have been input.

Figure 22:
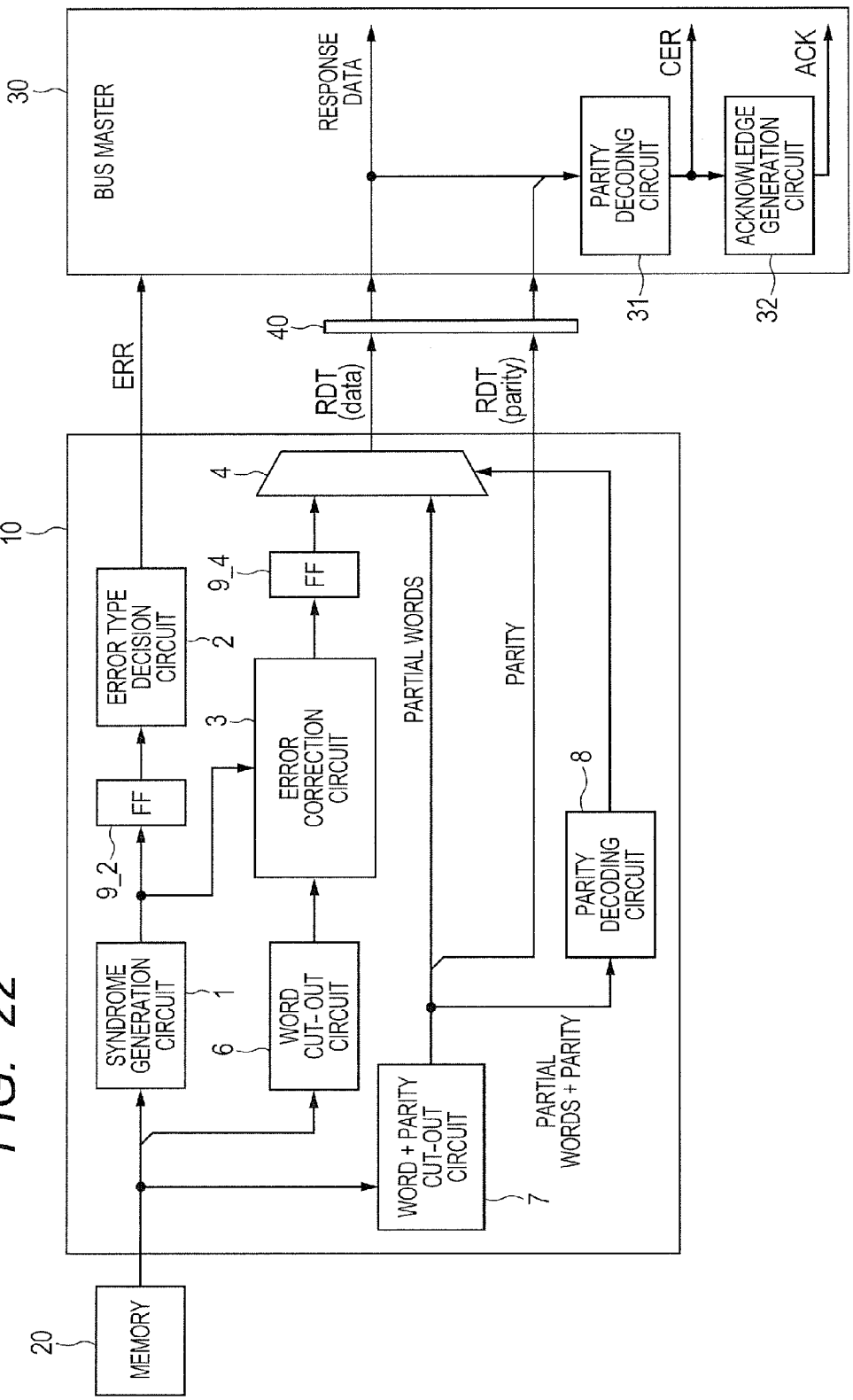
FIG. 22 is a block diagram illustrating one configurational example when the memory and the error processing circuit according to the third embodiment are loaded on the system that the data bus is protected with the parity code.

FIG. 22 is a block diagram illustrating one configurational example when the memory 20 and the error processing circuit 10 according to the third embodiment are loaded on the system that the bus data is protected with the parity code. The configuration of the error processing circuit 10 is different from the configuration of the error processing circuit 10 illustrated in FIG. 14 according to the third embodiment in the points that the acknowledge generation circuit 5 is omitted, outputting of the correctable error signal CER and the acknowledge signal ACK is omitted and the parity RDT (parity) corresponding to the partial word is output. Since other configurations and operations in the error processing circuit 10 are the same as those of the error processing circuit 10 in FIG. 14, description thereof is omitted. The partial word RDT (data) and the corresponding parity RDT (parity) that the error processing circuit 10 outputs are output to the read bus 40 and are input into the bus muster 30 together with the error type ERR. The bus muster 30 includes the parity decoding circuit 31, the acknowledge generation circuit 32 and so forth and generates by itself the correctable error signal CER and the acknowledge signal ACK on the basis of the partial word RDT (data) and the corresponding parity RDT (parity) which have been input.

When the memory 20 and the error processing circuit 10 are loaded on the system that the bus data is protected with the parity code as mentioned above, the partial word RDT (data) and the corresponding parity RDT (parity) may be just output to the read bus 40 and therefore it is possible to make the acknowledge generation circuit unnecessary.

The bit length of the partial word is optional not depending on the examples described in the second and third embodiments and it may be made to match the data width of the read bus 40.

Fifth Embodiment

<RAM>

Although in the above-mentioned first to fourth embodiments, description has been made mostly on data reading out of the memory, it is also possible to cope with data writing into the memory by loading an ECC generation circuit on the error processing circuit 10.

Figure 23:
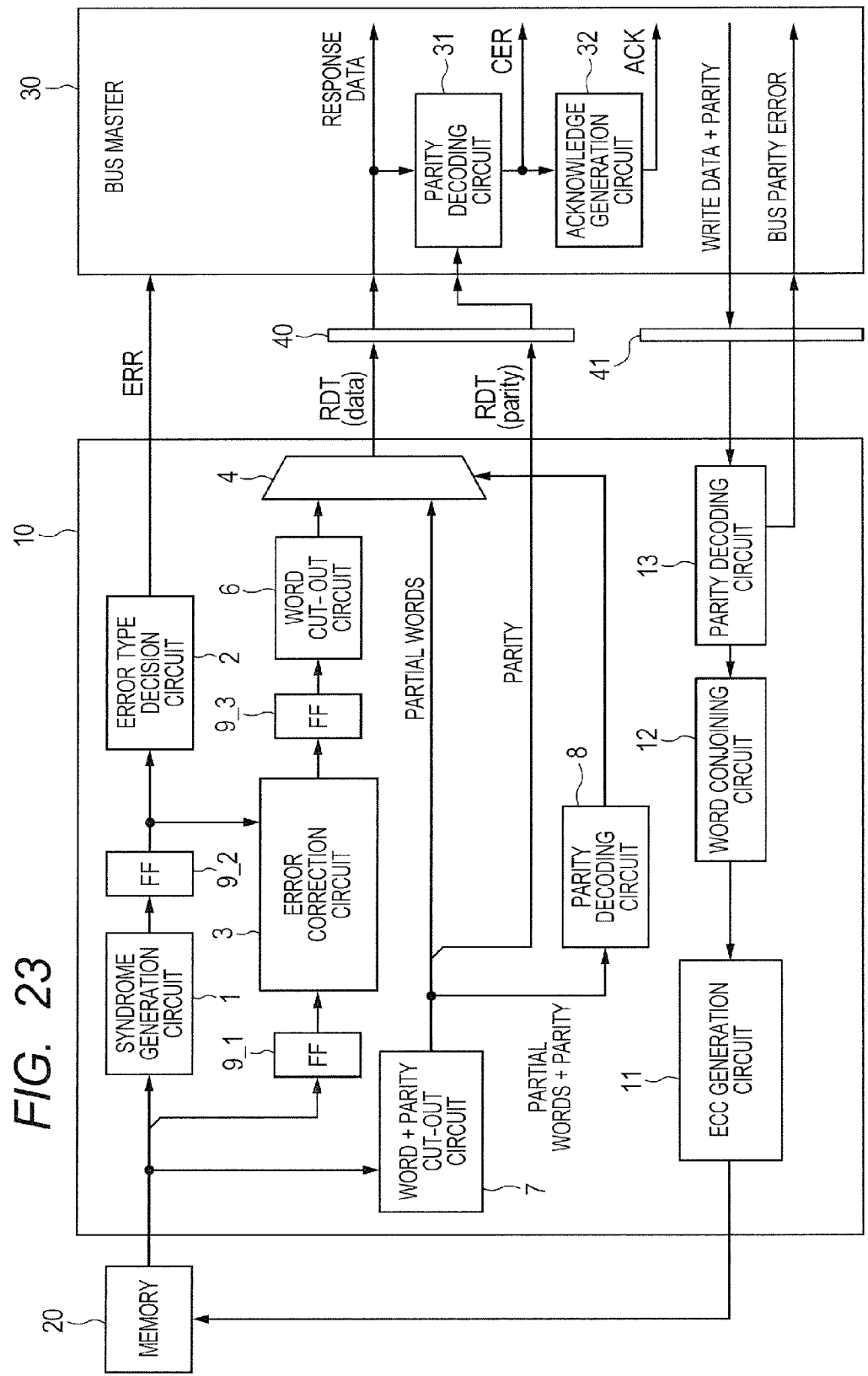
FIG. 23 is a block diagram illustrating one configurational example that a circuit for writing data into the memory is added to the configuration in FIG. 21.

FIG. 23 is a block diagram illustrating one configurational example that a circuit for writing data into the memory is added to the configuration in FIG. 21. The bus master 30 supplies write data and a parity to the error processing circuit 10 via a write bus 41. The error processing circuit 10 includes a parity decoding circuit 13 to be used for write data, executes parity decoding (the parity check) on the input write data and parity, and when the presence of an error has been decided, sends a bus parity error back to the bus master 30. Since the bit length of the write data is the same as the bit length of the partial word, a word conjoining circuit 12 waits till completion of write data supply which is performed a plurality of times, configures one word of the memory 20 and inputs the word into an ECC generation circuit 11. The ECC generation circuit 11 generates the ECC additional bits by using the generation matrix (illustrated in FIG. 10), adds the ECC additional bits to the write data and writes the write data with the ECC additional bits being added into the memory 20.

Figure 24:
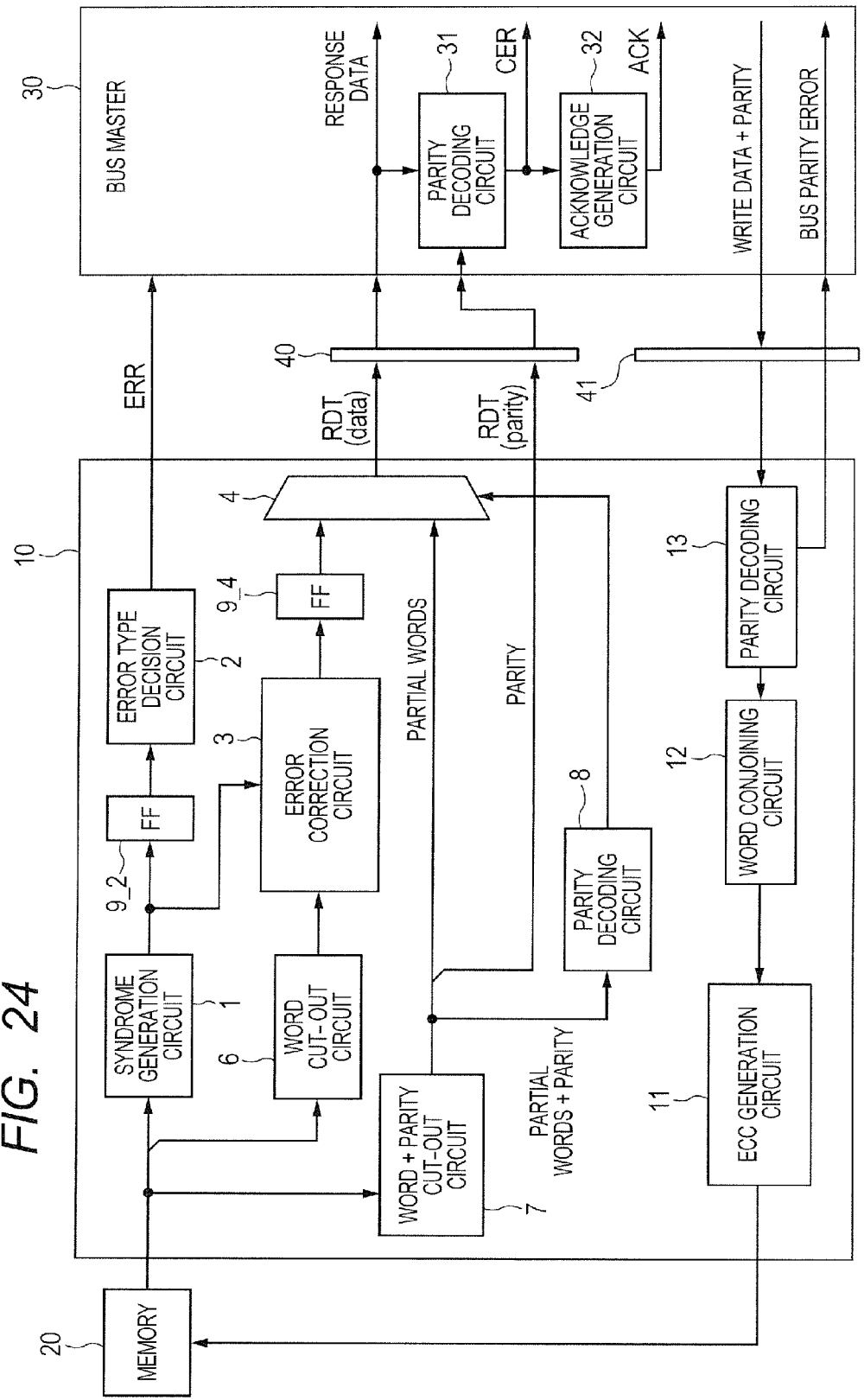
FIG. 24 is a block diagram illustrating one configurational example that the circuit for writing the data into the memory is added to the configuration in FIG. 22.

FIG. 24 is a block diagram illustrating one configurational example that the circuit for writing data into the memory is added to the configuration in FIG. 22. The bus master 30 supplies the write data and the parity to the error processing circuit 10 via the write bus 41. The error processing circuit 10 includes the parity decoding circuit 13 to be used for write data, executes parity decoding (the parity check) on the input write data and parity, and when the presence of the error has been decided, sends the bus parity error back to the bus master 30. Since the bit length of the write data is the same as the bit length of the partial word, the word conjoining circuit 12 waits till completion of write data supply which is performed the plurality of times, configures one word of the memory 20 and inputs the word into the ECC generation circuit 11. The ECC generation circuit 11 generates the ECC additional bits by using the generation matrix (illustrated in FIG. 15), adds the ECC additional bits to the write data and writes the write data with the ECC additional bits being added into the memory 20.

Although the examples that the word data to be written into the memory is supplied from the write bus 41 as the plurality of partial words have been illustrated in FIG. 23 and FIG. 24, the error processing circuit 10 may be configured such that the partial words of the number which is smaller than the number of partial words used in the examples illustrated in FIG. 23 and FIG. 24 are supplied and written into the memory 20 by read-modify-write processing. That is, the supplied word data which includes the partial words is once read out of the memory 20, is corrected by the error correction circuit 3 and thereafter is supplied to the word conjoining circuit 12. The word conjoining circuit 12 rewrites partial data supplied from the write bus 41 in the main body data which has been corrected by the error correction circuit 3 and then supplied from the error correction circuit 3, configures new main body data and supplies the new main body data to the ECC generation circuit 11. The ECC generation circuit 11 generates the ECC additional bits by using the generation matrix (illustrated in FIG. 15), adds the generated ECC additional bits to the new main body data and writes the new main body data with the ECC additional bits being added into the memory 20.

It is possible to also cope with data writing into the memory by loading the ECC generation circuit 11 on the error processing circuit 10.

The bit length of the partial word is optional not depending on the examples described in the second and third embodiments and it may be made to match the data width(s) of the read bus 40 and/or the write bus 41.

Although there is no particular limitation on the memory 20 and the error processing circuit 10 described in the first to fifth embodiments and the buses 40 and 41 and the bus muster 30 described in the fourth and fifth embodiments, a semiconductor device (the data processing circuit) is formed on a single semiconductor substrate made of silicon and so forth by using, for example, a well-known semiconductor integrated circuit manufacturing technology.

In the foregoing, the invention which has been made by the inventors and others of the present patent application has been specifically described on the basis of the preferred embodiments. However, it goes without saying that the present invention is not limited to the above-mentioned embodiments and may be altered and modified in a variety of ways within the scope not deviating from the gist of the present invention.

For example, the arrangement of the flip-flops which configure the pipeline may be appropriately changed.

What is claimed is:

1. A data processing circuit, comprising:
   a memory that stores information bits whose length is N×L bits;
   a memory controller stores L partial words that are divided in units of N bits from the information bits, and generates M ECC (Error Correction Code) additional bits by multiplying the information bits by a generation matrix of M rows×(N×L) columns; and
   a parity check circuit generates syndromes that are generated by multiplying pieces of the information bits which have been read out from the memory by a check matrix by conjoining together the generation matrix and a unit matrix of M rows×M columns, and decides that there is no error when all bits of the syndromes are '0', that a single-bit error occurs when there is at least a column from among the columns which matches the syndromes, and that a double-bit error occurs when there is no column which matches the syndromes,
   wherein the parity check circuit comprises:
      an error correction circuit that corrects an error including the single-bit error or the double-bit error, by inverting data at a corresponding bit position in the pieces of the information bits which have been read out of the memory,
   wherein L, M and N are integers.

2. The data processing circuit according to claim 1,
   wherein the parity check circuit comprises:
      the error correction circuit that corrects the error by inverting data at the corresponding bit position in the pieces of information bits which have been read out of the memory based on the number of the column which matches the syndromes corresponds to the number of the bit position of the information bits that the error has been generated when the parity check circuit decided that the single-bit error occurs.

3. The data processing circuit according to claim 2,
   wherein the error correction by the error correction circuit allows single-error correction and double-error detection.

4. The data processing circuit according to claim 1,
   wherein the memory controller generates parity bits as an exclusive OR of the L partial words and configures each of the parity hits for giving an even-numbered parity to the first parity word, and
   the parity check circuit performs the parity check based on the parity bits corresponding to the L partial words respectively.

5. The data processing circuit according to claim 4, further comprising:
   a read bus,
   wherein the read bus includes a read data bus which is a same as a partial word from among the L partial words in bit width and a read parity signal, and
   wherein the parity check circuit outputs the partial word which is the object of the parity check to the read data bus and outputs the parity bit corresponding to the partial word concerned to the read parity signal.

6. The data processing circuit according to claim 5, further comprising:
   a write bus,
   wherein the write bus includes a write data bus which is a same as the partial word in bit width and a write parity signal;
   a word conjoining circuit that configures a main body data in the word data to be written into the memory by mutually conjoining the partial words which are input from the write bus and supplies the configured main body data to an error correction code generation circuit; and
   the error correction code generation circuit that generates the error correction additional bits from the supplied main body data by using a generation matrix, conjoins together the error correction additional bits and the main body data concerned and thereby generates the word data to be written into the memory.

7. The data processing circuit according to claim 6,
   wherein, in the generation matrix, a plurality of partial matrixes which are configured by rows other than the L rows in the plurality of columns respectively corresponding to the L partial words are mutually equal, and
   wherein the error correction circuit corrects the error in an input partial word on a basis of at least one partial word in the L partial words which configure the word data and the error correction additional bits.

8. The data processing circuit according to claim 7, further comprising:
   a read bus,
   wherein the read bus includes a read data bus which is the same as the partial word in bit width and a read parity signal, and
   wherein the parity check circuit outputs the partial word which is the object of the parity check to the read data bus and outputs the parity bit corresponding to the partial word concerned to the read parity signal.

9. The data processing circuit according to claim 8, further comprising:
a write bus,
wherein the write bus includes a write data bus which is the same as the partial word in bit width and a write parity signal;
a word conjoining circuit configures a main body data in the word data to be written into the memory by mutually conjoining the partial words which are input from the write bus and supplies the main body data to the error correction code generation circuit, and
a error correction code generation circuit generates the error correction additional bits from the supplied main body data by using the generation matrix, conjoins together the error correction additional bits and the main body data concerned and thereby generates the word data to be written into the memory.

10. The data processing circuit according to claim 1, wherein the memory comprises a flash memory.

11. The data processing circuit according to claim 1, wherein the memory comprises a random access memory.

12. The data processing circuit according to claim 1,
wherein the parity check circuit is formed on a single semiconductor substrate, and
wherein L, M, and N are integers.

13. An error correction method of a data processing circuit, the error correction method comprising:
additional bits generation step that generates ECC (Error Correction Code) additional bits by multiplying N×L information bits by a generation matrix of M rows× (N×L) columns;
division step that divides the information bits into L partial words in units of N bits;
parity bits generation step that generates parity bits as the exclusive OR of the information bits and configures each of the parity bits for giving an even-numbered parity to the first partial word;
syndromes generation step that generates syndromes by multiplying pieces of the information bits which have been read out of a memory by a check matrix configures by conjoining together a generation matrix and a unit matrix of M rows×M columns;
decision step that decides that there is no error when all of the syndromes are '0', that a single-bit error occurs when there is a column from among the M columns which matches the syndromes, and that decides that a double-bit error occurs when there is no column from among the M columns which matches the syndromes; and
error correction step corrects an error including the single-bit error or the double-bit error, by inverting data at a corresponding bit position in the pieces of the information bits which have been read out of the memory and thereby information bits are restored,
wherein L, M and N are integers.

14. The error correction method according to claim 13,
wherein the error correction step further includes correcting the error by inverting data at the corresponding bit position in the pieces of information bits which have been read out of the memory based on a number of the column which matches the syndromes corresponds to a number of a bit position of the information bits that the error has been generated when in the decision step it is decided that the single-bit error occurs.

15. The error correction method according to claim 13,
wherein the parity bits generation step further includes generating parity bits as an exclusive OR of the L partial words and configures the parity bit for giving an even-numbered parity to the first parity word,
wherein the parity check is performed based on the parity bits corresponding to the L partial words respectively, and
wherein L, M and N are integers.

16. A data processing circuit, comprising:
a memory into which word data configured by main body data and redundant data is stored and out of which the word data is read in units of the word data,
wherein the main body data is divided into a plurality of partial words by a memory controller, the redundant data is configured by error correction additional bits the whole of which has been generated from the main body data on the basis of a predetermined error correction algorithm and the error correction additional bits include a plurality of parity bits which respectively correspond to the partial words;
an error processing circuit comprises:
a parity check circuit including an error correction circuit that receives input from the memory,
wherein the error correction circuit corrects an error in the main body data included in the input word data by using the redundant data included in the input word data on the basis of the error correction algorithm,
wherein the parity check circuit is a circuit which performs a parity check on the basis of at least one partial word included in the input word data and a parity bit corresponding to the partial word,
wherein L, M and N are integers,
wherein the memory stores information bits whose length is N×L bits,
wherein the error processing circuit stores L partial words that are divided in units of N bits from the information bit, and generates M ECC (Error Correction Code) additional bits by multiplying the information bits by a generation matrix of M rows×(N×L) columns, where L, M, and N are integers, and
wherein the parity check circuit generates syndromes that are generated by multiplying pieces of information bits which have been read out from the memory by a check matrix by conjoining together the generation matrix and a unit matrix of M rows×M columns, and decides that there is no error when all bits of the syndromes are '0', that a single bit error occurs when there is a column from among the M columns which matches the syndromes, and that a double-bit error occurs when there is no column from among the M columns which matches the syndromes.

* * * * *